US012295217B2

(12) United States Patent
Park et al.

(10) Patent No.: US 12,295,217 B2
(45) Date of Patent: May 6, 2025

(54) DISPLAY DEVICE

(71) Applicant: SAMSUNG DISPLAY CO., LTD., Yongin-si (KR)

(72) Inventors: Jun Hyun Park, Suwon-si (KR); Sung Jae Moon, Seongnam-si (KR); An Su Lee, Seoul (KR); Dong Woo Kim, Yongin-si (KR); Kang Moon Jo, Hwaseong-si (KR); Yong Duck Son, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 103 days.

(21) Appl. No.: 17/130,912

(22) Filed: Dec. 22, 2020

(65) Prior Publication Data

US 2021/0217835 A1    Jul. 15, 2021

(30) Foreign Application Priority Data

Jan. 9, 2020   (KR) .................. 10-2020-0003250

(51) Int. Cl.
*H10K 59/126*   (2023.01)
*H10K 50/844*   (2023.01)
*H10K 59/124*   (2023.01)
*H10K 59/131*   (2023.01)
*H10K 59/38*    (2023.01)
*H10K 59/80*    (2023.01)

(52) U.S. Cl.
CPC ......... *H10K 59/126* (2023.02); *H10K 50/844* (2023.02); *H10K 59/124* (2023.02); *H10K 59/131* (2023.02); *H10K 59/38* (2023.02); *H10K 59/8723* (2023.02); *H10K 59/873* (2023.02)

(58) Field of Classification Search
CPC ............ H10K 59/8723; H10K 59/124; H10K 59/131; H10K 59/126; H10K 59/38; H10K 59/873; H10K 50/844
See application file for complete search history.

(56) References Cited

U.S. PATENT DOCUMENTS

| | | |
|---|---|---|
| 10,020,733 B2 | 7/2018 | Xie |
| 2018/0047800 A1* | 2/2018 | Choi ................. H10K 59/8731 |
| 2018/0059862 A1 | 3/2018 | Zeng et al. |
| 2018/0151838 A1* | 5/2018 | Park .................. H10K 50/8445 |
| 2018/0151850 A1* | 5/2018 | Lee ..................... H10K 59/122 |
| 2019/0006442 A1* | 1/2019 | Byun ................. H10K 59/873 |
| 2019/0198587 A1 | 6/2019 | Park et al. |
| 2019/0237533 A1* | 8/2019 | Kim ................... H01L 27/0292 |

(Continued)

FOREIGN PATENT DOCUMENTS

| | | |
|---|---|---|
| EP | 3522229 | 8/2019 |
| EP | 3667732 | 6/2020 |
| KR | 10-2015-0016784 | 2/2015 |

(Continued)

*Primary Examiner* — Vongsavanh Sengdara
(74) *Attorney, Agent, or Firm* — F. CHAU & ASSOCIATES, LLC

(57) ABSTRACT

A display device including: a substrate including a display area and a non-display area; a light-emitting element disposed in the display area; an encapsulation layer covering the light-emitting element; a driving unit disposed in the non-display area; a dam surrounding the display area and overlapping the driving unit, and a shielding layer overlapping the driving unit.

22 Claims, 18 Drawing Sheets

(56) References Cited

U.S. PATENT DOCUMENTS

2020/0194534 A1    6/2020  Park et al.

FOREIGN PATENT DOCUMENTS

| KR | 10-2016-0083588   | 7/2016 |
| KR | 10-2018-0013452   | 2/2018 |
| KR | 10-2018-0018969 A | 2/2018 |
| KR | 10-2018-0036855   | 4/2018 |
| KR | 10-2018-0054385   | 5/2018 |
| KR | 10-2018-0054386   | 5/2018 |
| KR | 10-2018-0060851   | 6/2018 |
| KR | 10-2018-0061850   | 6/2018 |
| KR | 10-2018-0068011   | 6/2018 |
| KR | 10-2019-0004407 A | 1/2019 |
| KR | 10-2019-0047565 A | 5/2019 |
| KR | 10-2019-0076093 A | 7/2019 |
| KR | 10-2019-0093228 A | 8/2019 |

* cited by examiner

DISPLAY DEVICE

CROSS-REFERENCE TO RELATED APPLICATION

This application claims priority under 35 U.S.C. § 119 to Korean Patent Application No. 10-2020-0003250 filed in the Korean Intellectual Property Office on Jan. 9, 2020, the disclosure of which is incorporated by reference herein in its entirety.

(a) TECHNICAL FIELD

This present inventive concept relates to a display device, and more particularly, to an emissive display device such as an organic light emitting diode display.

(b) DESCRIPTION OF THE RELATED ART

An emissive display device converts electrical energy into light. An emissive display device includes a display panel, the display panel including light emitting elements on a substrate and circuit elements for driving the light emitting elements.

The display panel may further include a display area and a non-display area. The display area may form a screen, and the non-display area may be provided at the edge of the display area and include a driving circuit and a signal line.

There is an increasing demand for electronic devices with a large screen-to-body ratio (e.g., smartphones, tablet personal computers (PCs), notebooks, televisions, monitors, etc.). Typically, the non-display area of the display panel limits the increase of the screen-to-body ratio of the electronic device. Accordingly, efforts have been made to reduce the size of the non-display area.

SUMMARY

According to an embodiment of the present inventive concept, there is provided a display device including: a substrate including a display area and a non-display area; a light-emitting element disposed in the display area; an encapsulation layer covering the light-emitting element; a driving unit disposed in the non-display area; a dam surrounding the display area and overlapping the driving unit; and a shielding layer overlapping the driving unit.

The driving unit may include a driving circuit including a transistor and a driver signal line for transmitting a signal to the driving circuit, and the shielding layer may cover at least a portion of the driving circuit.

The display device may further include: an inorganic insulating layer disposed on the transistor; and an organic insulating layer disposed on the inorganic insulating layer, and the shielding layer may be in contact with the organic insulating layer where the shielding layer overlaps the driving circuit and may not be in contact with the inorganic insulating layer where the shielding layer overlaps the driving circuit.

The driving unit may include a driving circuit including a transistor and a driver signal line for transmitting a signal to the driving circuit, and the shielding layer may completely cover the driving circuit.

An inorganic insulating layer may be disposed on the transistor, an organic insulating layer may be disposed on the inorganic insulating layer, and the shielding layer may contact the organic insulating layer and the inorganic insulating layer in an area where the shielding layer overlaps the driving circuit.

A lower surface of the shielding layer may be in contact with the inorganic insulating layer and a first portion of an upper surface of the shielding layer may be in contact with the organic insulating layer.

A second portion of the upper surface of the shielding layer may be in contact with the dam.

The light-emitting element may include a first electrode, an emission layer disposed on the first electrode, and a second electrode disposed on the emission layer, and the shielding layer may include a same material as the first electrode or the second electrode.

The display device may further include: a pad disposed in the non-display area, and the shielding layer may include a same material as an uppermost layer of the pad.

The dam may include a first layer and a second layer disposed on the first layer, and the shielding layer may be disposed between the first layer and the second layer.

The dam may include a first layer and a second layer disposed on the first layer, and the shielding layer may be disposed on the second layer.

At least a portion of the dam may be covered by the shielding layer.

The display device may further include: a capping layer disposed between the light-emitting element and the encapsulation layer, and the shielding layer may contact the capping layer.

The driving unit may be integrated in the non-display area.

The display device may further include: a common voltage line disposed between the driving unit and the display area.

According to an embodiment of the present inventive concept, there is provided a display device including: a first substrate including a display area and a non-display area; a light-emitting element disposed in the display area; an encapsulation layer covering the light-emitting element and the display area and including at least one inorganic layer and at least one organic layer; a driving unit disposed in the non-display area; a dam overlapping the driving unit; a shielding layer overlapping the driving unit; a second substrate disposed on the encapsulation layer; and a sealing member bonding the first substrate and the second substrate.

The driving unit may include a driving circuit including a transistor and a driver control line for transmitting a control signal to the driving circuit, and the shielding layer may cover at least a portion of the driving circuit.

An inorganic insulating layer may be disposed on the transistor, an organic insulating layer may be disposed on the inorganic insulating layer, and the shielding layer may be in contact with the organic insulating layer where the shielding layer overlaps the driving circuit and may not be in contact with the inorganic insulating layer where the shielding layer overlaps the driving circuit.

The display device may further include: an inorganic insulating layer disposed on the transistor; and an organic insulating layer disposed on the inorganic insulating layer, and the shielding layer may contact the organic insulating layer and the inorganic insulating layer in an area where the shielding layer overlaps the driving circuit.

The display device may further include a capping layer disposed between the light-emitting element and the encapsulation layer, and the shielding layer may contact the capping layer.

A color filter may be disposed on the second substrate and include at least one of a quantum dot and a phosphor.

A capping layer may be disposed between the light-emitting element and the encapsulation layer, a functional layer may be disposed on the capping layer between the light-emitting element and the encapsulation layer, and at least one of the capping layer and the functional layer may completely cover the shielding layer.

According to an embodiment of the present inventive concept, there is provided a display device including: a substrate including a display area and a non-display area; a light-emitting element disposed in the display area; a driving circuit disposed in the non-display area; driving lines connected to the driving circuit, the driving lines disposed in the non-display area; a dam disposed in the non-display area and overlapping the driving lines; and a shielding layer overlapping the driving circuit.

The dam may surround the display area.

The display device may further include an encapsulating layer covering the light-emitting element and extending to the non-display area, wherein the encapsulating layer is disposed between the dam and the driving circuit.

The shielding layer may be connected to a common voltage line.

The shielding layer may be an extended portion of the light-emitting element.

The shielding layer may overlap at least a portion of the dam.

The shielding layer may be disposed between the dam and the driving circuit.

DETAILED DESCRIPTION OF THE EMBODIMENTS

Figure 1:
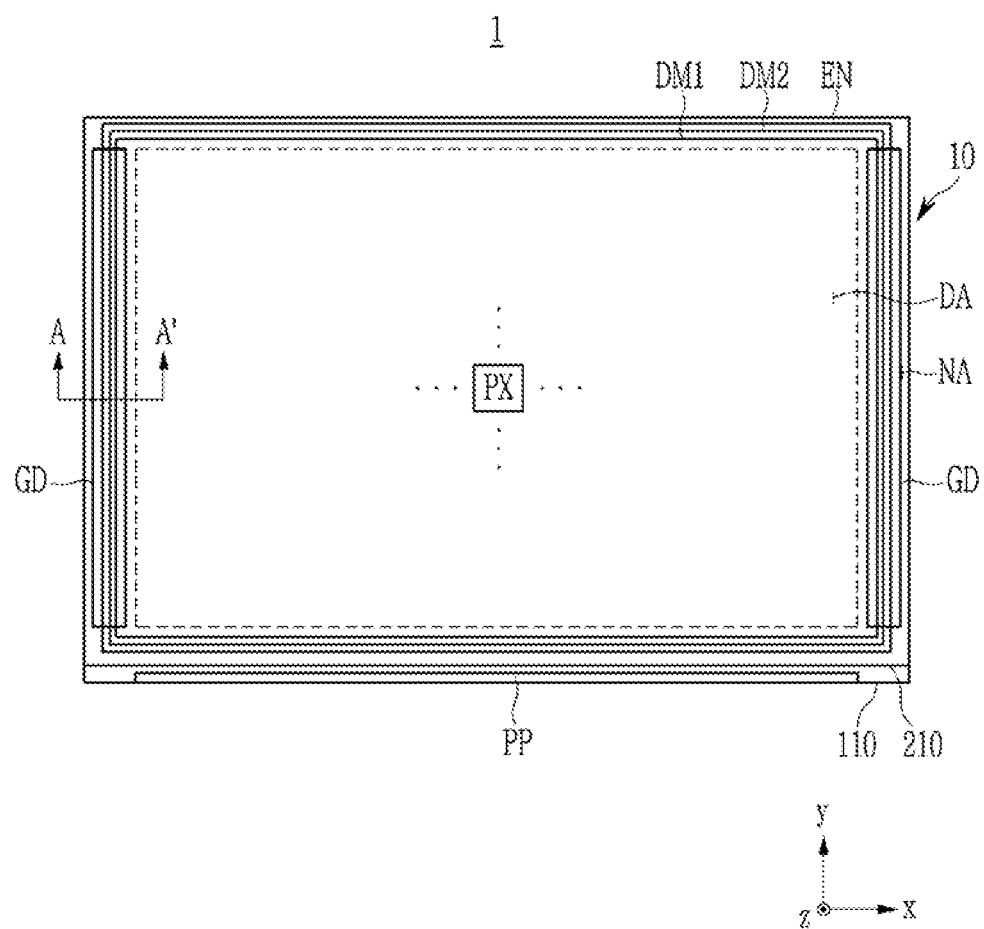
FIG. 1 is a top plan view schematically showing a display device according to an embodiment of the present inventive concept.

Embodiments of the present inventive concept will be described more fully hereinafter with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present.

In the drawings, as symbols used for indicating directions, "x" is a first direction, "y" is a second direction perpendicular to the first direction, and "z" is a third direction perpendicular to the first direction and the second direction.

Figure 2:
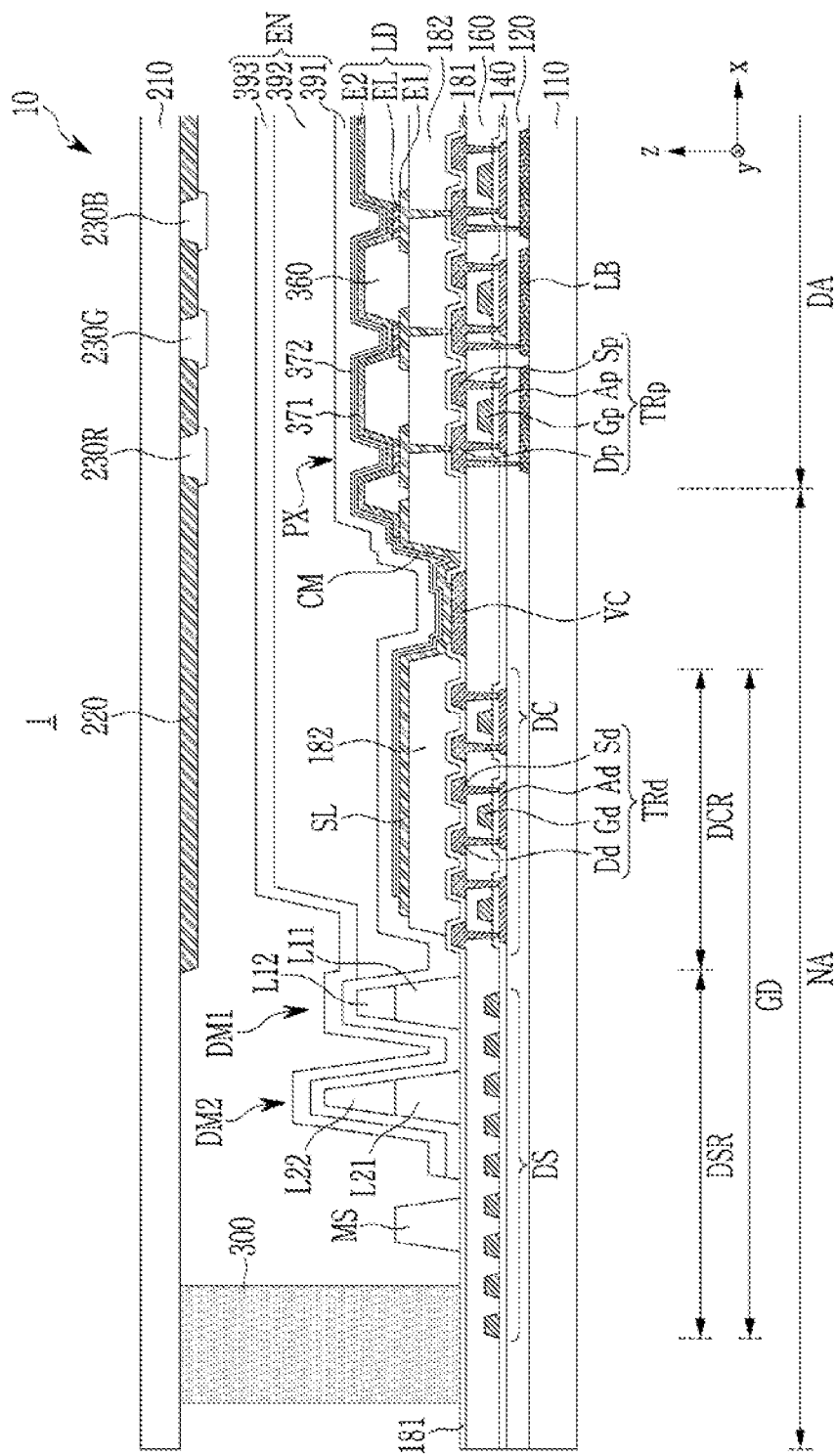
FIG. 2 is a schematic cross-sectional view taken along a line A-A' in FIG. 1 according to an embodiment of the present inventive concept.

A display device according to embodiments of the present inventive concept will now be described in detail with reference to accompanying drawings, FIG. 1 is a top plan view schematically showing a display device according to an embodiment of the present inventive concept, and FIG. 2 is a schematic cross-sectional view taken along a line A-A' in FIG. 1 according to an embodiment of the present inventive concept.

Referring to FIG. 1, the display device 1 includes a display panel 10 including a display area DA and a non-display area NA. In FIG. 1, the inside and outside of a dotted-line rectangle correspond to the display area DA and the non-display area NA, respectively.

In the display panel 10, the display area DA corresponds to a screen on which an image is displayed. Circuits and/or signal lines for generating and/or transferring various signals applied to the display area DA are disposed in the non-display area NA around the display area DA. The non-display area NA may surround the display area DA. However, the non-display area NA may be disposed on one or fewer than all sides of the display area DA.

In the display area DA of the display panel 10, pixels PX are arranged in a matrix, for example. Signal lines such as gate lines (also referred to as scan lines), data lines, and driving voltage lines are also disposed in the display area DA. The gate line, the data line, and the driving voltage line are connected to each pixel PX, and each pixel PX may receive a gate signal (also referred to as a scan signal), a data signal, and a driving voltage from these signal lines. Each pixel PX may include a light-emitting element that may be an organic light emitting diode. The display area DA may further include signal lines such as sensing lines or emission control lines that may be connected to the pixel PX, or signal lines for transferring signals different from those described above.

In the display area DA, a touch sensor layer for detecting a user's contact or non-contact touch may be disposed. Although the rectangular display area DA is illustrated in FIG. 1, the display area DA may have various shapes such as polygons, circles, ellipses, etc., and may be polygons having rounded corners.

In the non-display area NA of the display panel 10, a pad portion PP is provided. The pad portion PP includes pads for receiving signals from the outside of the display panel 10. The pad portion. PP may be extended along an edge of the display panel 10, for example, in the first direction x. The display device 1 may include a flexible printed circuit film bonded to the pad part PP. Pads of the flexible printed circuit film may be electrically connected to the pads of the pad part PP.

Depending on the size of the display panel 10, the display panel 10 may include a plurality of pad portions PP spaced apart from each other in the first direction x, and the flexible printed circuit film may be bonded to each of the pad portions PP one by one. For example, a first pad portion may be disposed at the left side of the display panel 10 and a second pad portion separated from the first pad portion may be disposed at the right side of the display panel 10. In FIG. 1, the pad portion PP is disposed at the lower end of the display panel 10, but the pad portion PP may be disposed at the upper end of the display panel 10, or may be disposed at the lower end and the upper end of the display panel 10.

The display device 1 includes a driving unit disposed in the non-display area NA of the display panel 10. The driving unit may generate and/or process various signals for driving the display panel 10. The driving unit may include a data driver for applying the data signal to the data lines, a gate driver GD for applying the gate signal to the gate lines and a signal controller for controlling the data driver and the gate driver.

The gate driver GD may be integrated on the non-display area NA of the display panel 10, in particular, on a first substrate 110, and may be disposed on both left and right sides or one side of the display area DA. The data driver may be in the form of an integrated circuit chip, and may be disposed in the flexible printed circuit film bonded to the pad portion PP or in the non-display area NA of the display panel 10. The signal controller may be in the form of an integrated circuit chip, and may be disposed on a printed circuit board to which the flexible printed circuit film is bonded. The data driver and the signal controller may be provided together in a single integrated chip.

The gate driver GD disposed in the non-display area NA is connected to the gate lines to apply the gate signals to the pixels PX. The gate driver GD is integrated in the non-display area NA. The gate driver GD may receive driver control signals such as a vertical start signal, clock signals, a low voltage corresponding to a gate-off voltage, and the like from the signal controller to generate a gate signal (e.g., a gate-on voltage and a gate-off voltage) and apply them to the gate lines. The gate driver GD includes a driving circuit (e.g., a shift register) for generating and outputting the gate signal by using the received signals, and the driving circuit includes stages that are connected to each other. The gate driver GD also includes driver for controlling lines that provide the driver control signals to the stages. The stages may be connected one-to-one to the gate lines, and may sequentially output the gate signals to the gate lines every frame. Each stage may include transistors and may include at least one capacitor. Some signals of the driver control signals may be provided from a device other than the signal controller.

The display panel 10 includes an encapsulation layer EN entirely covering the display area DA. The encapsulation layer seals the display area DA, particularly the light-emitting elements, to prevent moisture or oxygen from penetrating inside the display panel 10, particularly the display area DA. The edge of the encapsulation layer EN may be disposed between the edge of the display panel 10 and the display area DA.

Dams DM1 and DM2 surrounding the display area DA may be disposed in the non-display area NA. The dams DM1 and DM2 prevent the formation material of the encapsulation layer EN, particularly an organic material such as a monomer, from overflowing to the outside of the display panel 10. Although two dams DM1 and DM2 are shown in FIG. 1, the display device 1 may include fewer or more dams.

The cross-sectional structure of the display panel 10 is now described in detail with reference to FIG. 2 along with FIG. 1.

Referring to FIG. 2, a cross-section near the left edge of the display panel 10 is schematically illustrated, and the display area DA is also shown along with the non-display area NA. The vicinity of the right edge of the display panel 10 may have a cross-sectional structure that is substantially symmetrical with the vicinity of the left edge.

As shown in FIG. 2, the gate driver GD includes a driving circuit DC and driver control lines DS disposed adjacent to each other in the non-display area NA. For example, the driving circuit DC and the driver control lines DS may be disposed in the same layer. The driving circuit DC including transistors TRd is disposed in a driving circuit region DCR, and the driver control lines DS are disposed in the driver control line region DSR. Each of the driving circuit region DCR and the driver control line region DSR may extend in the second direction y between the edge of the display panel 10 and the display area DA. The driving circuit region DCR may be disposed closer to the display area DA than the driver control line region DSR. In other words, the driver control line region DSR may be adjacent to the edge of the display panel 10. The driver control lines DS may be electrically connected to the driving circuit DC, and may transmit signals such as a vertical start signal, a clock signal, and the like as well as signals that provide a predetermined low voltage to the driving circuit DC. At least one of the driver control lines DS may be disposed in the driving circuit region DCR or may be disposed between the driving circuit region DCR and the display area DA.

Referring to the cross-sectional structure of FIG. 2, the display panel 10 includes the first substrate 110 and various layers, wirings, and elements formed thereon. The display panel 10 may include a second substrate 210 bonded to the first substrate 110 by a sealing member 300. Although a large number of pixels are arranged in the display area DA of the display panel 10, only three pixels are illustrated and described to avoid complicated drawings. In addition, although each pixel PX of the display area DA includes the transistors, the capacitor, and the light emitting element, just one transistor TRp and one light emitting element LD connected thereto are illustrated. In addition, although the driving circuit DC of the non-display area NA includes the transistors and the capacitor, some transistors TRd are illustrated and described.

The first substrate 110 may be a rigid substrate made of glass, quartz, ceramic, or the like. The first substrate 110 may be a flexible substrate made of a polymer such as polyimide.

A light blocking layer LB may be disposed on the first substrate 110. For example, a light blocking layer LB may be provided under each of the transistors TRp. The light blocking layer LB may prevent external light from reaching a semiconductor layer Ap of the transistor TRp, thereby preventing deterioration of certain characteristics of the semiconductor layer Ap. A leakage current of the transistor TRp, e.g., the driving transistor of the pixel circuit, may be controlled by the light blocking layer LB. The light blocking layer LB may include a material that does not transmit light in a wavelength band to be blocked, and may be made of a conductive material such as a metal or a metal alloy, Therefore, the light blocking layer LB may function as an electrode to which a specific voltage is applied in the display panel 10. In this case, the change rate of the current in the saturation region of the voltage-current characteristic graph of the transistor TRp is lowered, so that the characteristics of the driving transistor may be improved. The light blocking layer LB may be electrically connected to another transistor (e.g., a switching transistor) or a signal line (e.g., a driving voltage line) of the pixel PX, or may be in a floating state. The light blocking layer LB may also be disposed under the transistor TRd of the driving circuit DC.

A buffer layer 120 may be disposed on the light blocking layer LB. The buffer layer 120 may block impurities that may diffuse from the first substrate 110 to the semiconductor layers Ap and Ad in the process of forming the semiconductor layers Ap and Ad and reduce the stress applied to the first substrate 110. The buffer layer 120 may include an inorganic insulating material such as a silicon oxide or a silicon nitride.

The semiconductor layers Ap and Ad of the transistors TRp and TRd may be disposed on the buffer layer 120. The semiconductor layers Ap and Ad may include a channel region overlapping gate electrodes Gp and Gd, and a source region and a drain region disposed on both sides thereof. The semiconductor layers Ap and Ad may include polysilicon, amorphous silicon, or an oxide semiconductor.

A first insulating layer 140 including an inorganic insulating material such as a silicon oxide and a silicon nitride may be disposed on the semiconductor layers Ap and Ad. The first insulating layer 140 may be referred to as a gate insulating layer.

A gate conductor including the gate lines, the driver control lines DS, and the gate electrodes Gp and Gd of the transistors TRp and TRd may be disposed on the first insulating layer 140. The gate conductor may include a metal or a metal alloy such as molybdenum (Mo), copper (Cu), aluminum (Al), silver (Ag), chromium (Cr), tantalum (Ta), titanium (Ti), or the like, and may be a multilayer such as titanium (Ti)/molybdenum (Mo). The driver control lines DS may be at the same layer as the gate conductor. In the present specification, "at the same layer" or "formed on the same layer" may mean that the corresponding components are formed of the same material in the same process. For example, the driver control lines DS may be formed of the same material as the gate conductor in the same process. A second insulating layer 160 may be disposed on the first insulating layer 140 and the gate conductor. The second insulating layer 160 may include an inorganic insulating material such as a silicon oxide or a silicon nitride. The second insulating layer 160 may be referred to as an interlayer insulating layer.

On the second insulating layer 160, a data conductor including the data line, the driving voltage line, a common voltage line VC, the source electrodes Sp and Sd, and the drain electrodes Dp and Dd of the transistors TRp and TRd may be disposed.

The source electrodes Sp and Sd and the drain electrodes Dp and Dd may be respectively connected to the source region and the drain region of the semiconductor layers Ap and Ad through contact holes formed in the second insulating layer 160 and the first insulating layer 140. One of the source electrode Sp and the drain electrode Dp may be connected to the light blocking layer LB through a contact hole formed in the second insulating layer 160, the first insulating layer 140, and the buffer layer 120. For example, in the transistor TRp, the drain electrode Dp is connected to the light blocking layer LB and the source electrode Sp is connected to the semiconductor layer Ap.

The common voltage line VC may transmit a power voltage of a predetermined level that may be applied to a light emitting element LD of the pixel PX, and for example, may transmit the common voltage ELVSS. One end and the other end of the common voltage line VC may be electrically connected to the pad part PP, and may surround the display area DA. In other words, both ends of the common voltage line VC are connected to the pad part PP.

The data conductor may include a metal such as copper (Cu), aluminum (Al), silver (Ag), chromium (Cr), tantalum (Ta), titanium (Ti), and the like or a metal alloy thereof. The data conductor may be a multilayer such as titanium/copper (Ti/Cu), titanium/aluminum (Ti/Al), titanium/copper/titanium (Ti/Ca/Ti), titanium/aluminum/titanium (Ti/Al/Ti), and molybdenum/aluminum/molybdenum (Mo/Al/Mo). At least a portion of the driver control lines DS may be formed of the same layer as that of the data conductor. In other words, a portion of the driver control lines DS may be formed of the same material in the same process as the data conductor. The common voltage line VC may be at the same layer as the data conductor.

The gate electrode Gp, the source electrode Sp, and the drain electrode Dp form the transistor TRp along with the semiconductor layer Ap. The gate electrode Gd, the source electrode Sd, and the drain electrode Dd form the transistor TRd along with the semiconductor layer Ad. In the shown in FIG. 2, the drain electrode Dp is connected to the light blocking layer LB through a contact hole formed in the second insulating layer 160, the first insulating layer 140, and the buffer layer 120. In the transistors TRp and TRd, and the gate electrodes Gp and Gd are disposed above the semiconductor layers Ap and Ad, but the structure of the transistors TRp and TRd is not limited thereto and may be variously changed.

On the data conductor, a third insulating layer 181 including an inorganic insulating material such as a silicon nitride, a silicon oxide, and the like may be disposed. The third insulating layer 181 of the inorganic insulating layer may be referred to as a passivation layer. The third insulating layer 181 may be omitted.

A fourth insulating layer 182 including an organic insulating material may be disposed on the third insulating layer 181. The fourth insulating layer 182 is an organic insulating layer that may include, for example, a polyimide, an acrylic polymer, a siloxane polymer, or the like. The fourth insulating layer 182 may be referred to as a planarization layer. The fourth insulating layer 182 may cover at least a portion of the driving circuit DC.

The first electrode E1 of the light emitting element LD may be disposed on the fourth insulating layer 182. The first electrode E1 may be connected to the drain electrode Dp through a contact hole formed in the fourth insulating layer 182. A connection member CM that is in contact with and connected to the common voltage line VC may be disposed on the fourth insulating layer 182. For the connection of the connecting member CM and the common voltage line VC, portions of the third insulating layer 181 and the fourth insulating layer 182 overlapping the common voltage line VC may be removed. For example, the connecting member CM may contact the common voltage line VC through an opening in the third and fourth insulating layers 181 and 182.

A shielding layer SL overlapping the driving circuit DC is also disposed on the fourth insulating layer 182. The transistors TRd constituting the driving circuit DC are vulnerable to static electricity such that they may be damaged when static electricity flows therein. The shielding layer SL may shield the driving circuit DC to prevent the static electricity from damaging the driving circuit DC during the manufacturing process of the display device 1 or handling of the display device 1. The shielding layer SL may cover at least a part, almost all, or all of the driving circuit DC. The shielding layer SL may be formed lengthwise in the second direction y to cover the driving circuit DC.

To effectively dissipate the static electricity, the shielding layer SL may be grounded. For example, the shielding layer SL may be electrically connected to the common voltage line VC. In this case, since the shielding layer SL has a potential of the common voltage ELVSS provided from the common voltage line VC, an undesirable capacitive coupling may be generated between the shielding layer SL and the driving circuit DC. To reduce the capacitance associated with the capacitive coupling, the shielding layer SL is disposed on the fourth insulating layer 182. Since the fourth insulating layer 182 is relatively thick and made of an organic insulating material, when the shielding layer SL is disposed on the fourth insulating layer 182, the capacitance is reduced due to the distance between the shielding layer SL and the driving circuit DC; therefore, the capacitive coupling may be weakened. Therefore, even when the shielding layer SL is provided to overlap the driving circuit DC, the signal generated by the driving circuit DC (for example, the gate signal) has little or no capacitive effect. In the driving circuit region DCR, the shielding layer SL may in contact with the fourth insulating layer 182 and may not be in contact with the third insulating layer 181. The shielding layer SL may however contact the third insulating layer 181 outside the driving circuit region DCR.

The shielding layer SL may be electrically connected to the connecting member CM. In FIG. 2, the shielding layer SL is electrically and physically connected to the connecting member CM, and is electrically connected to the common voltage line VC through the connecting member CM. Alternatively, the shielding layer SL may be directly connected to the common voltage line VC. The shielding layer SL may not be grounded to the common voltage line VC, but may be grounded to a wire having a different voltage or potential. The shielding layer SL may be in a floating state without being grounded. For example, the shielding layer SL may not be connected to the common voltage line VC or the connection member CM.

The shielding layer SL, which is a conductive layer, may be formed at the same layer as the first electrode E1, in other words, the shielding layer SL may be formed of the same material in the same process used to form the first electrode E1. The connecting member CM may also be at the same layer as the first electrode E1. The first electrode E1, the shielding layer SL, and the connection member CM may include a metal or a metal alloy such as silver (Ag), nickel (Ni), gold (Au), platinum (Pt), aluminum (Al), copper (Cu), or aluminum neodymium (AlNd), or aluminum nickel lanthanum (AlNiLa). The first electrode E1, the shielding layer SL, and the connecting member CM may include a transparent conductive material such as indium tin oxide (ITO) and indium zinc oxide (IZO). The first electrode E1, the shielding layer SL, and the connecting member CM may be a multilayer such as ITO/silver (Ag)/ITO and ITO/aluminum (Al).

Openings may be formed in the shielding layer SL. This is to allow gasses from the fourth insulating layer 182, which is an organic insulating layer, to escape.

A fifth insulating layer 360 having an opening overlapping the first electrode E1 may be disposed on the fourth insulating layer 182. An opening of the fifth insulating layer 360 may define each pixel area, and may be referred to as a pixel defining layer. The fifth insulating layer 360 may be an organic insulating layer including an organic insulating material.

An emission layer EL is disposed on the first electrode E1 and the second electrode E2 is disposed on the emission layer EL. The second electrode E2 is connected to the connection member CM. Since the connection member CM is connected to the common voltage line VC, the second electrode E2 may be electrically connected to the common voltage line VC through the connection member CM. Therefore, when the common voltage line VC transfers the common voltage ELVSS, the second electrode E2 may receive the common voltage ELVSS. The second electrode E2 has light transmittance by forming a thin layer of a metal or a metal alloy having a low work function such as calcium (Ca), barium (Ba), magnesium (Mg), aluminum (Al), silver (Ag), or the like. The second electrode E2 may be formed of a transparent conductive material such as ITO or IZO.

The first electrode E1, the emission layer EL, and the second electrode E2 of each pixel PX form the light-emitting element LD such as the organic light emitting diode. The first electrode E1 and the second electrode E2 may face each other. The first electrode E1 may be an anode of the organic light emitting diode, and the second electrode E2 may be a cathode of the organic light emitting diode. The first electrode E1 may be referred to as a pixel electrode, and the second electrode E2 may be referred to as a common electrode. The light emitting element LD may be a light emitting element for emitting blue light or a light emitting element for emitting white light. Alternatively, the light emitting element LD may include light emitting elements emitting three primary colors, for example, a light emitting element for emitting red light, a light emitting element for emitting green light, and a light emitting element fro emitting blue light.

A capping layer 371 may be disposed on the second electrode E2 and a functional layer 372 may be disposed on the capping layer 371. In other words, the capping layer 371 may be disposed between the second electrode E2 and the functional layer 372. The capping layer 371 may improve light efficiency by adjusting a refractive index. The functional layer 372 may prevent damage to underlying layers and improve light efficiency when the encapsulation layer EN is formed. The capping layer 371 may include an inorganic insulating material, and the functional layer 372 may include a material such as lithium fluoride (LIF). The capping layer 371 and the functional layer 372 may be formed up to approximately the shielding layer SL. The capping layer 371 and the functional layer 372 may cover a portion of the shielding layer SL and not cover another portion of the shielding layer SL. In addition, the capping layer 371 and the functional layer 372 may cover the entirety of the shielding layer SL. The lower surface of the capping layer 371 may be in contact with the upper surface of the shielding layer SL.

The encapsulation layer EN may be disposed on the capping layer 371 and the functional layer 372. The encapsulation layer EN seals the light emitting element LD to prevent penetration of moisture or oxygen from the outside. The encapsulation layer EN may cover the entire display area DA, and the edge of the encapsulation layer EN may be disposed in the non-display area NA and may be disposed farther away from the display area DA than the driving circuit region DCR. For example, the encapsulation layer EN may extend to the driver control line region DSR.

In the encapsulation layer EN, at least one inorganic layer and at least one organic layer are stacked. In FIG. 2, the encapsulation layer EN is a thin film encapsulation layer including a first inorganic layer 391, an organic layer 392, and a second inorganic layer 393. In the encapsulation layer EN, the first inorganic layer 391 and the second inorganic layer 393 prevent penetration of moisture, etc., and the organic layer 392 planarizes the surface of the encapsulation layer EN, and particularly the surface of the second inorganic layer 393 in the display area DA. The first inorganic layer 391 and the second inorganic layer 393 may include an inorganic insulating material such as a silicon oxide and a silicon nitride. The organic layer 392 may include organic materials such as acrylic resin, methacryl resin, polyisoprene, vinyl resin, epoxy resin, urethane resin, cellulose resin, and perylene resin.

The first inorganic layer 391 and the second inorganic layer 393 are wider than the organic layer 392, and the first inorganic layer 391 and the second inorganic layer 393 may be in contact near the edge of the encapsulation layer EN. The edge of the first inorganic layer 391 and the edge of the second inorganic layer 393 may be substantially coincident with each other. By forming the first inorganic layer 391 and the second inorganic layer 393 to be wide, it is possible to prevent the penetration of moisture or oxygen from the side surface of the display area DA and to elongate and complicate the penetration path of moisture or oxygen, and thus, delay such penetration.

The edges of the first inorganic layer 391 and the second inorganic layer 393 may be disposed in the driver control line region DSR of the gate driver GD and may be disposed on the driver control line DS. In other words, the first inorganic layer 391 and the second inorganic layer 393 may be disposed to cover a part of the driver control line region DSR.

The dams DM1 and DM2 may also be disposed in the non-display area NA. The dams DM1 and DM2 prevent an organic material such as a monomer from flowing out when forming the organic layer 392 of the encapsulation layer EN. Here, the edges of the organic layer 392 of the encapsulation layer EN may be disposed between the dams DM1 and DM2 and the display area DA. For example, an edge of the organic layer 392 of the encapsulation layer EN may extend to and contact the dam DM1. In this case, the organic layer 392 is disposed between the dam DM1 and the driving circuit DC. The first inorganic layer 391 and the second inorganic layer 393 of the encapsulation layer EN extend onto the dam DM1 and DM2 to cover the dams DM1 and DM2. In this case, since the contact area between the first inorganic layer 391 and the second inorganic layer 393 increases, the adhesion between the first inorganic layer 391 and the second inorganic layer 393 may increase.

In the region of the display panel 10 where the gate driver GD is disposed, the dams DM1 and DM2 overlap the gate driver GD. In addition, the dams DM1 and DM2 may overlap the driver control line DS. When the dams DM1 and DM2 are formed in such a manner, the non-display area NA does not increase due to the formation of the dams DM1 and DM2. Accordingly, the width of the non-display area NA may be reduced or the formation and design margins of the wiring or elements disposed in the non-display area NA may be increased. For example, the widths of the non-display areas NA may be reduced compared with the case where the dams DM1 and DM2 are formed between the gate driver GD and the display area DA or formed outside the gate driver GD, and accordingly, the screen ratio of the display device 1 may be increased. In FIG. 2, the dams DM1 and DM2 may be disposed in the driver control line region DSR, but may not be disposed in the driving circuit region DCR; however, the dams DM1 and DM2 may be disposed in both of the driver control line region DSR, and the driving circuit region DCR or may be disposed only in the driving circuit region DCR.

The dams DM1 and DM2 may include a first dam DM1 located closer to the display area DA and a second dam DM2 located further away from the display area DA. The dams DM1 and DM2 may be formed of at least one layer. The dams DM1 and DM2 may be formed using an insulating layer formed in the display area DA.

For example, when the dams DM1 and DM2 are formed in a single layer, the dams DM1 and DM2 may be formed on the same layer as the fourth insulating layer 182 or on the same layer as the fifth insulating layer 360. When the dams DM1 and DM2 are formed in multiple layers as shown, the first layers L11 and L21 of the lower layer may be formed on the same layer as the fourth insulating layer 182 and the second layers L12 and L22 of the upper layers may be formed on the same layer as the fifth insulating layer 360.

Although the first dam DM1 or the lower layer L11 of the first dam DM1 is formed on the same layer as the fourth insulating layer 182, the first dam DM1 is separated from the fourth insulating layer 182. If the first dam DM1 is attached to or continuously formed with the fourth insulating layer 182, there is no space accommodating the organic material forming the organic layer 392 of the encapsulation layer EN immediately before the first dam DM1. Therefore, the first dam DM1 and the fourth insulating layer 182 are separated from each other to provide a space for accommodating the organic material of the organic layer 392, and as a result, the driving circuit DC of the gate driver GD may include an area that is not covered by the fourth insulation layer 182.

Even though both the first dam DM1 and the second dam DM2 are formed in multiple layers, the second dam DM2 may be formed higher than the first dam DM1. For example, when forming the fifth insulating layer 360 and the upper layers L12 and L22, the upper layer L22 of the second dam DM2 may be made higher than the upper layer L12 of the first dam DM1 by using a halftone mask. In the alternative, the first dam DM1 and the second dam DM2 may be formed at substantially the same height.

The lower surfaces of the dams DM1 and DM2 may contact the third insulating layer 181. When the display panel 10 does not include the third insulating layer 181, the lower surfaces of the dams DM1 and DM2 may be in contact with the second insulating layer 160 or may be in contact with the driver control lines DS and/or the driving circuit DC.

A mask supporting bar MS may be disposed in the non-display area NA. The light emission layer EL, the second electrode E2, the capping layer 371, the functional layer 372, and the first and second inorganic layers 391 and 393 of the encapsulation layer EN may be formed through deposition using a metal mask with an open region to form these layers. The mask supporting bar MS supports this metal mask. The mask supporting bar MS may be disposed farther from the display area DA than the dams DM1 and DM2. The mask supporting bar MS may be formed on the same layer as the fourth insulating layer 182, or may be formed on the same layer as the fifth insulating layer 360.

The second substrate 210, which is bonded to the first substrate 110 by the sealing member 300 disposed around the edge of the display panel 10, is disposed on the encapsulation layer EN. To expose the pad portion PP to the outside for bonding the printed circuit film, the second substrate 210 may be formed shorter than the first substrate 110 in the region where the pad portion PP is disposed, for example, a lower end portion of the display panel 10 as shown in FIG. 1.

The sealing member 300 is formed to completely surround the display area DA. The sealing member 300 bonds the first substrate 110 and the second substrate 210, and prevents impurities such as moisture and oxygen from penetrating between the first substrate 110 and the second substrate 210 from the outside. Therefore, the display area DA may have an air-tight seal due to the first substrate 110, the second substrate 210, and the sealing member 300 therebetween. The sealing member 300, for example, may be formed by coating a sealing material on the second substrate 210 or the first substrate 110, arranging the second substrate 210 or the first substrate 110 so that the sealing material is between the first substrate 110 and the second substrate 210, and then irradiating a laser on an area where the sealing material is coated. The coated sealing material may be a frit, such as a glass frit. When the sealing material is irradiated with a laser and heated, the sealing material is melted and adhered to the first substrate 110 and the second substrate 210 like an adhesive, and cured in an adhered state, thereby forming the sealing member 300 to tightly bonding the first substrate 110 and the second substrate 210. As described above, since the display area DA is also sealed by the encapsulation layer EN, the display area DA may be double-sealed.

The sealing member 300 may at least partially overlap the gate driver GD, in particular, the driver control line region DSR. As such, when the sealing member 300 and the driving circuit DC overlap with each other, the area of the non-display area NA on the left and right sides of the display area DA may be reduced, so that the left and right bezel widths of the display device 1 may be reduced. Further, when the gate driver GD is provided at just one side of the display area DA, the bezel on another side of the display device 1 may be eliminated.

The second substrate 210 may be formed of a transparent and rigid material such as glass, quartz, ceramic, or the like. The second substrate 210 may be spaced apart from the encapsulation layer EN by a predetermined distance.

A light blocking member 220 and color filters 230R, 230G, and 230B may be disposed on the surface of the second substrate 210 toward the first substrate 110. The color filters 230R, 230G, and 230B may include a red color filter 230R, a green color filter 230G, and a blue color filter 230B. A capping layer may be disposed on the color filters 230R, 230G, and 230B.

The light blocking member 220 is formed in a region except the pixel region (for example, a region overlapping the emission layer EL), and prevents light transmission in regions other than the pixel region. The light blocking member 220 may be disposed between the red color filter 230R and the green color filter 230G, between the green color filter 230G and the blue color filter 230B, and between the blue color filter 230B and the red color filter 230R. The light blocking member 220 may partition a region where the red color filter 230R, the green color filter 230G, and the blue color filter 230B are disposed.

When the light emitting element LD is a light emitting element for emitting blue light, the red color filter 230R may convert blue light into red light, the green color filter 230G may convert blue light into green light, and the blue color filter 230B may transmit blue light as is. Therefore, the red color filter 230R and the green color filter 230G may be referred to as color conversion layers, and the blue color filter 230B may be referred to as a transmission layer. The red color filter 230R may include at least one of a quantum dot and a phosphor for converting blue light into red light. The green color filter 230G may include at least one of a quantum dot and a phosphor that converts blue light into green light. The blue color filter 230B may include a resin that transmits blue light, and may further include a dye or pigment. A blue light cutting filter (e.g., a yellow color filter) that transmits wavelengths other than the blue wavelength band and blocks the blue wavelength band may be disposed between the red color filter 230R and the green color filter 230G, and the second substrate 210.

A touch sensor layer including touch electrodes for sensing a touch may be disposed on the second substrate 210, and a polarization layer may be further provided to reduce external light reflection.

According to an embodiment of the present inventive concept, the display device 1 may include: the substrate 110 including the display area DA and the non-display area NA; the light-emitting element LD disposed in the display area DA; the encapsulation layer EN covering the light-emitting element LD; a driving unit DC/DS disposed in the non-display area NA; the dam DM1/DM2 surrounding the display area DA and overlapping the driving unit DC/DS; and the shielding layer SL overlapping the driving unit DC/DS.

Hereinafter, embodiments of the present inventive concept are described with reference to FIG. 3 to FIG. 15 while focusing on differences from the above-described embodiment, FIG. 3 to FIG. 15 are schematic cross-sectional views corresponding to a region taken along a line A-A' in FIG. 1 according to an embodiment of the present inventive concept, respectively.

Figure 3:
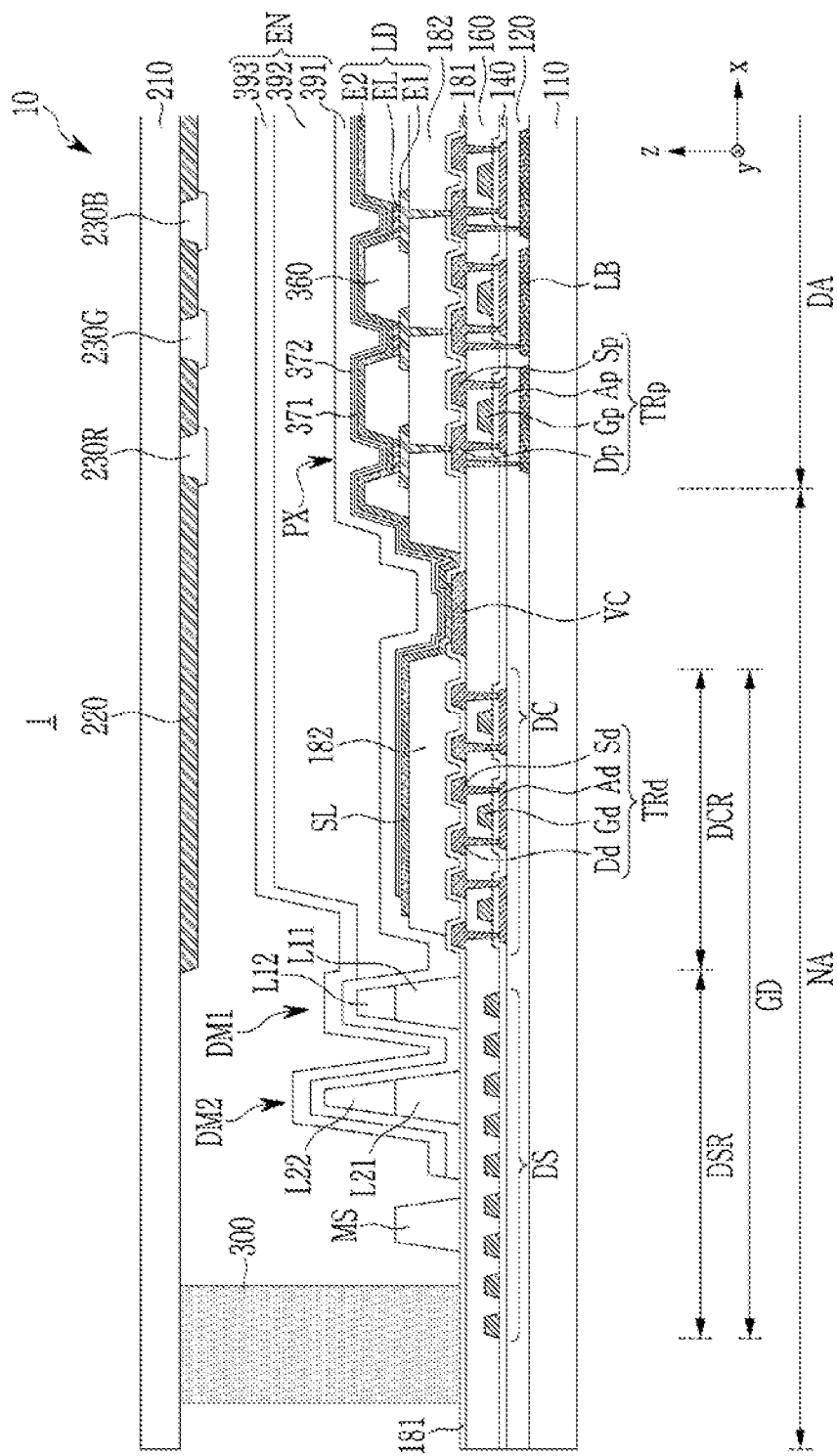
FIGS. 3, 4, 5, 6, 7, 8, 9, 10, 11, 12, 13, 14 and 15 are schematic cross-sectional views corresponding to a region taken along a line A-A' in FIG. 1 according to an embodiment of the present inventive concept, respectively.

Referring to FIG. 3, different from the embodiment of FIG. 2, the display panel 10 does not include the connecting member CM electrically connecting the second electrode E2 to the common voltage line VC. Here, the second electrode E2 is directly connected to the common voltage line VC. The shielding layer SL may be formed by extension of the second electrode E2. In other words, the shielding layer SL overlapping the driving circuit DC may be formed of the same material and in the same process used to form the second electrode E2. Since the shielding layer SL is connected to the second electrode E2, the shielding layer SL may be grounded with the common voltage ELVSS.

Figure 4:
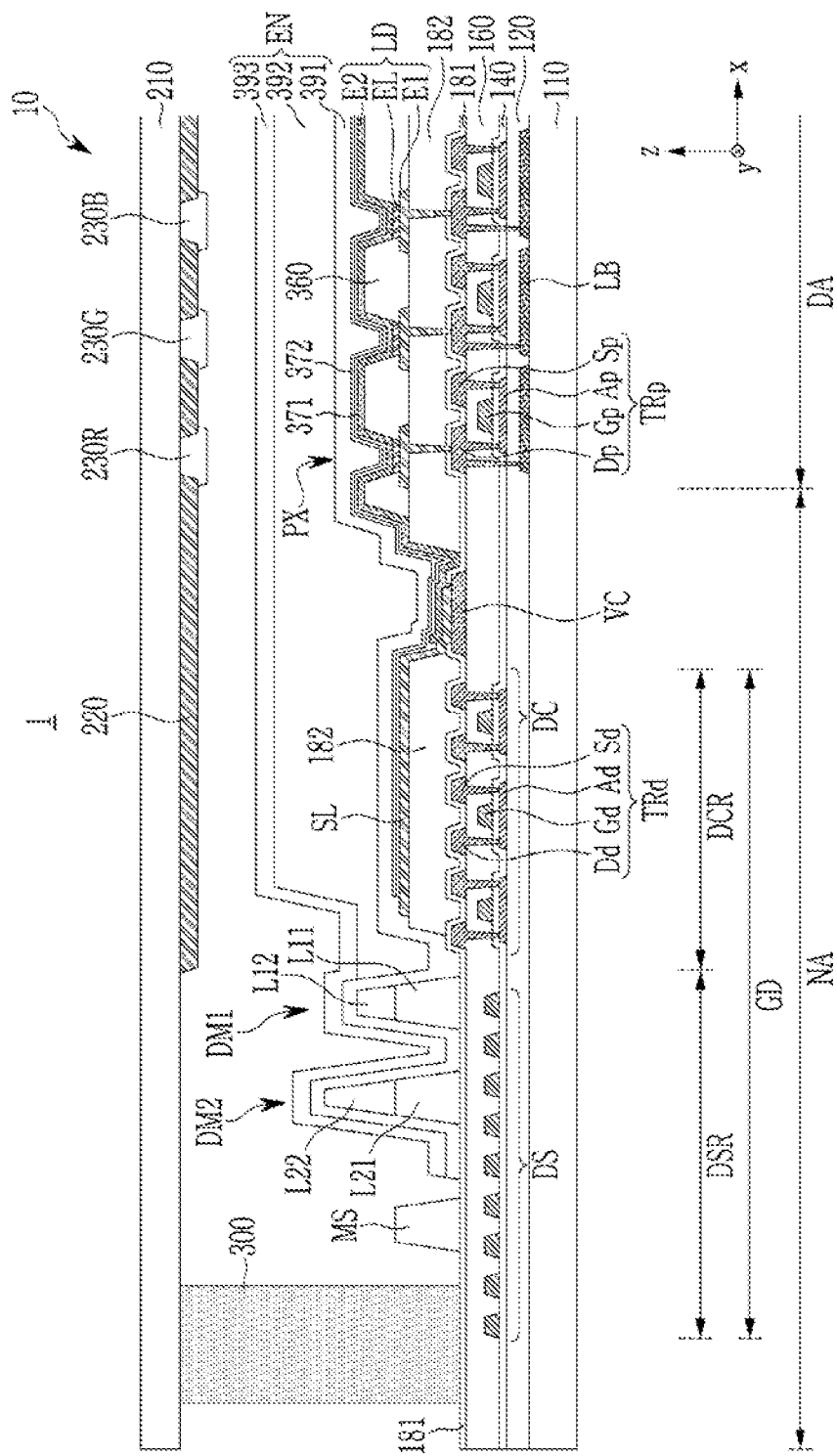

Referring to FIG. 4, the shielding layer SL, which may be formed on the same layer as the first electrode E1, is connected to the common voltage line VC. For example, the shielding layer SL may be directly connected to the common voltage line VC and partially overlapped with the second electrode E2. Therefore, the shielding layer SL may be grounded with the common voltage ELVSS. The display panel 10 may not include the connection member CM that electrically connects the second electrode E2 to the common voltage line VC. Here, the second electrode E2 may be connected to the common voltage line VC. In the right and left non-display area NA of the display area DA, which include the shielding layer SL to protect the gate driver GD from the static electricity, the second electrode E2 may be connected to the common voltage line VC through the shielding layer SL without being directly connected. To the common voltage line VC. However, the second electrode E2 may be directly connected to the common voltage line VC in the upper and/or right non-display area NA of the display area DA where the shielding layer SL is not disposed.

Figure 5:
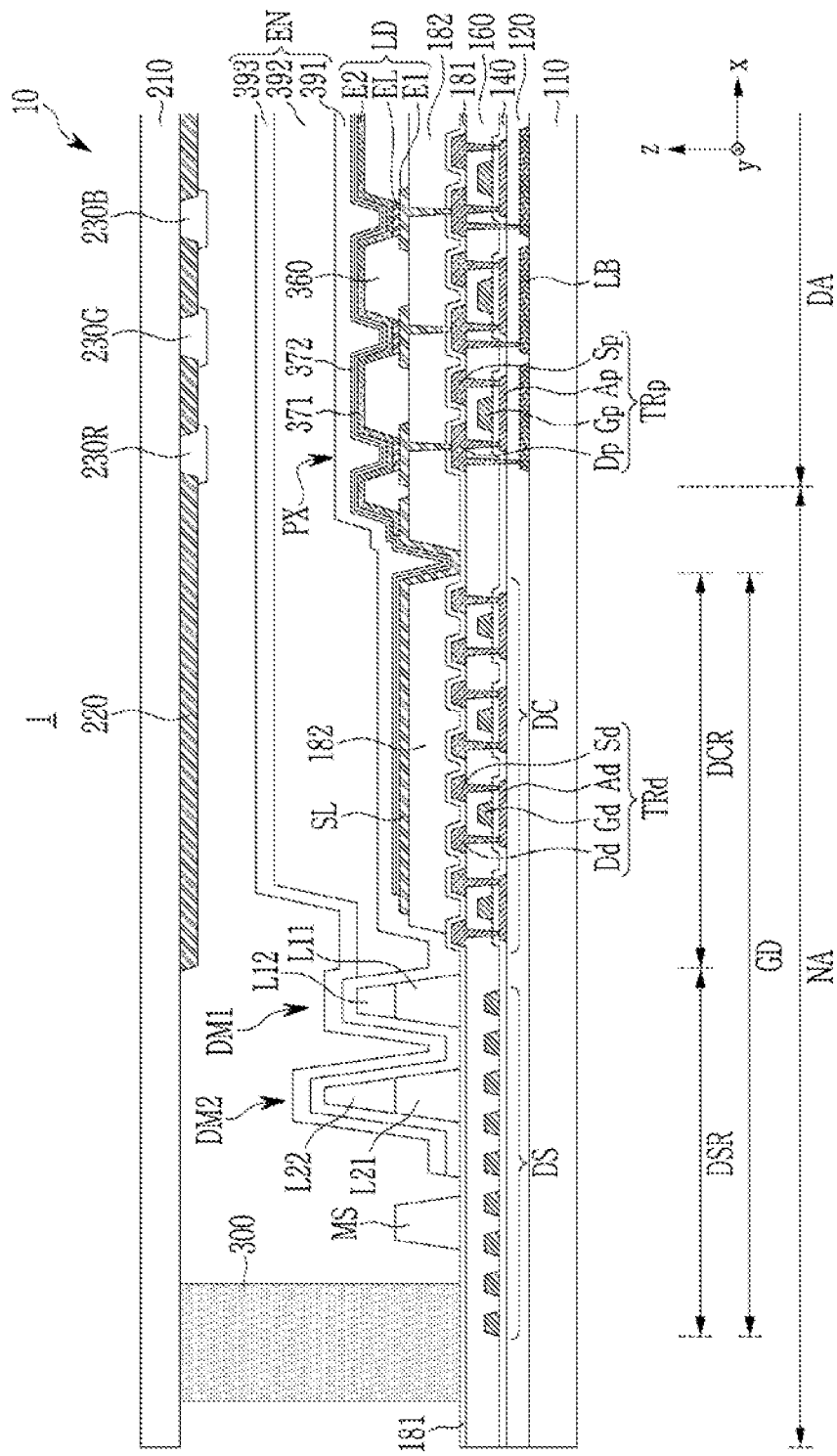

Referring to FIG. 5, the common voltage line VC is not included between the display area DA and the gate driver GD as compared to the above-described embodiments. Since the common voltage line VC is not provided, the gate driver GD may be disposed closer to the display area DA, and the width of the left and right non-display areas NA of the display area DA may be reduced. The common voltage line VC may be disposed in the upper and lower non-display areas NA of the display area DA, and the second electrode E2 may be connected directly to the common voltage line VC or through the connecting member CM in the upper and lower non-display areas NA of the display area DA. In this case, to supply the common voltage ELVSS to the common voltage line VC disposed in the upper non-display area NA of the display area DA, the pad portion PP is also disposed in the upper non-display area NA. The shielding layer SL may be formed on the same layer as the first electrode E1 and may be electrically connected to the second electrode E2. Therefore, the shielding layer SL may be grounded with the common voltage ELVSS.

Figure 6:
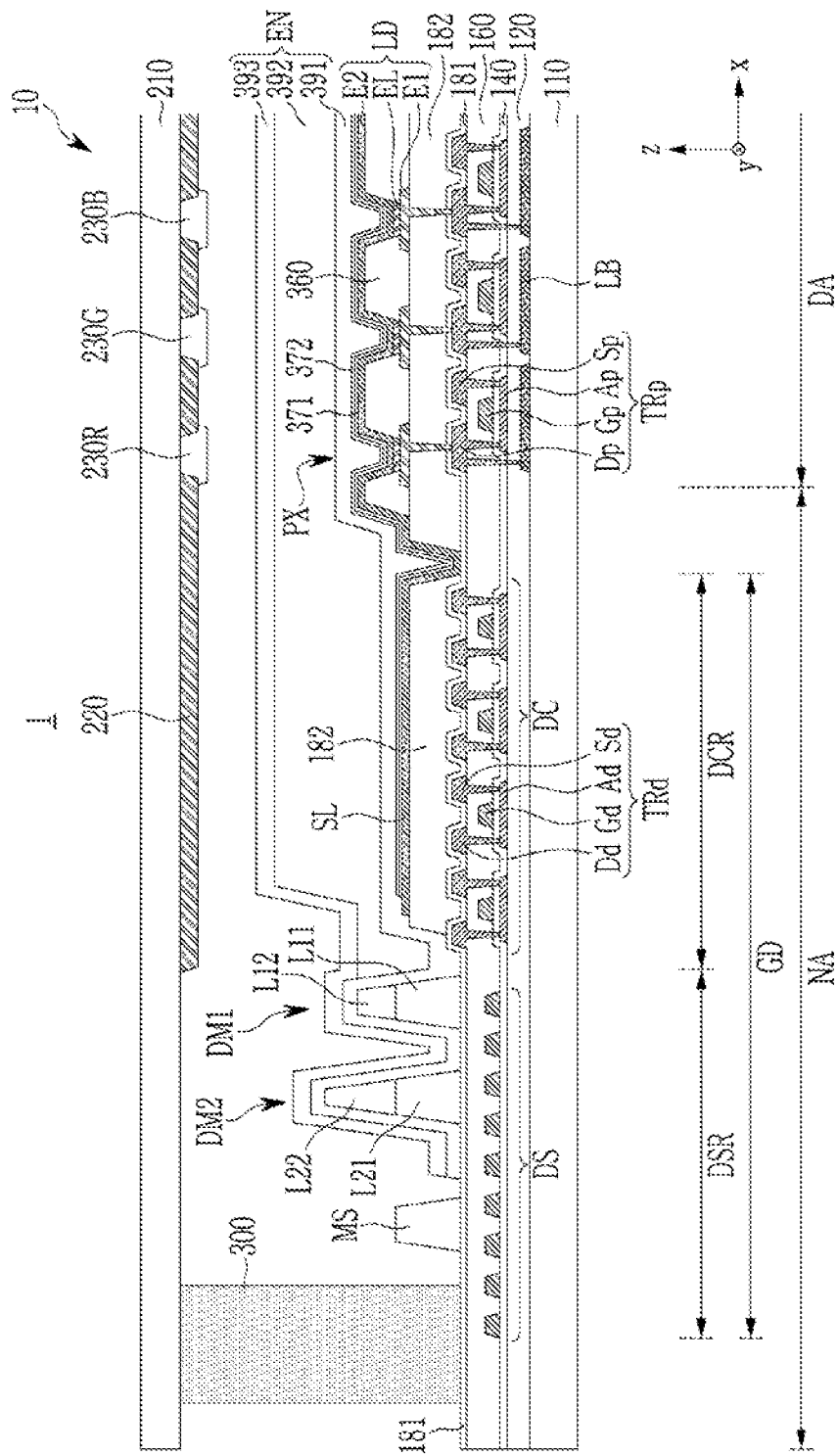

Referring to FIG. 6, as in the embodiment of FIG. 5, the display panel 10 does not include the common voltage line VC between the display area DA and the gate driver GD. However, the shielding layer SL is formed by extending the second electrode E2 to cover the driving circuit DC. Since the shielding layer SL is electrically and physically connected to the second electrode E2, the shielding layer SL may be grounded with the common voltage ELVSS.

Figure 7:
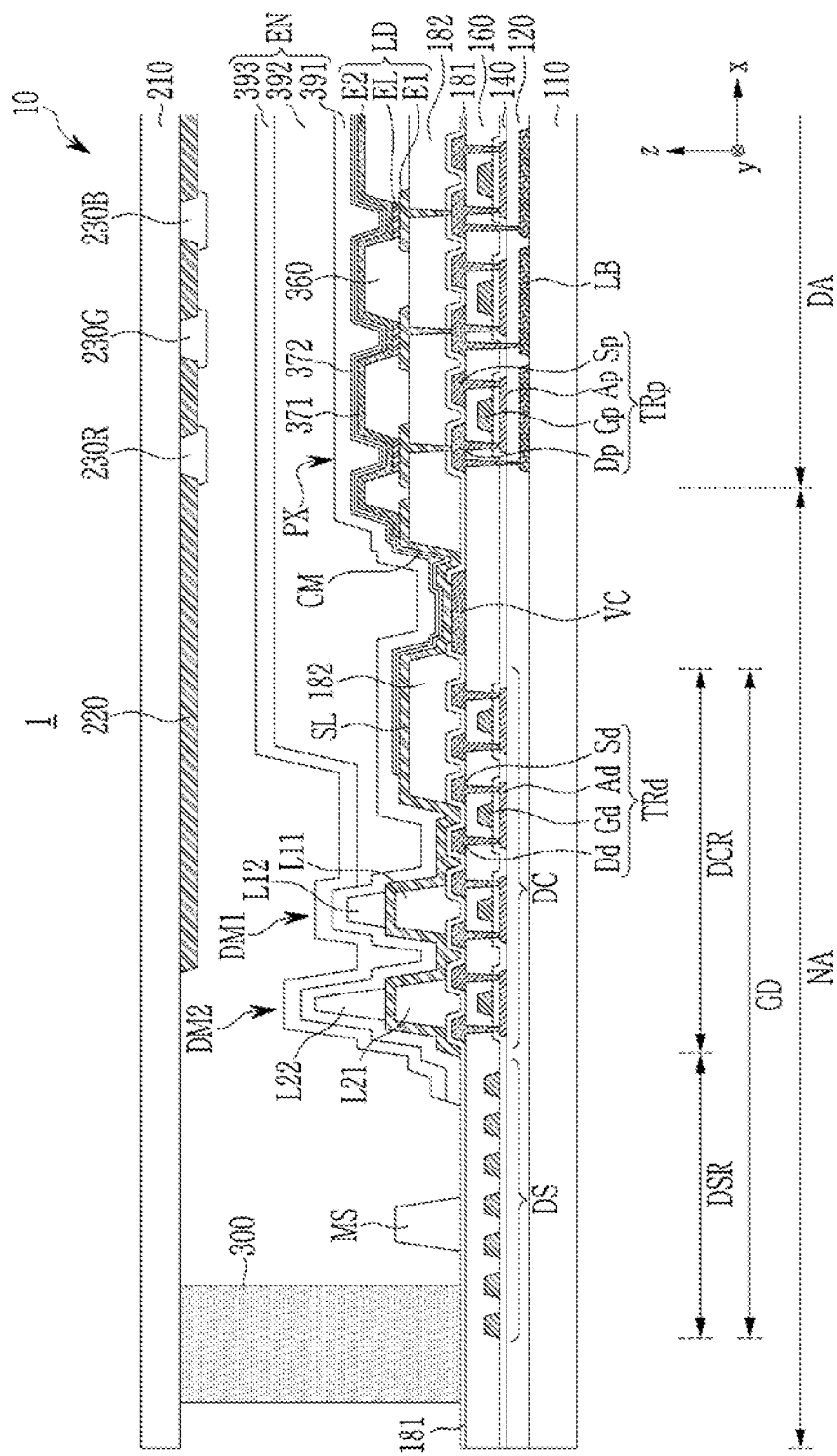

Referring to FIG. 7, the dams DM1 and DM2 overlap the driving circuit region DCR of the gate driver GD. The shielding layer SL may cover at least part or all of the driving circuit DC. In FIG. 7, the shielding layer SL is formed to completely cover the driving circuit DC. Since the dams DM1 and DM2 overlap the driving circuit region DCR, the shielding layer SL may be formed to overlap the dams. DM1 and DM2. For example, the shielding layer SL may be disposed between first and second portion of the first dam DM1 and between first and second portions of the second dam DM2. In another embodiment of the present inventive concept, at least one of the dams DM1 and DM2 may be disposed in the driver control line region DSR or may be disposed over the driver control line region DSR and the driving circuit region DCR.

The dams DM1 and DM2 may have lower layers L11 and L21 formed of the same layer and the same material as the fourth insulating layer 182 and upper layers L12 and L22 formed of the same layer as the fifth insulating layer 360. The shielding layer SL may be formed on the same layer as the first electrode E1. Accordingly, the shielding layer SL may be disposed between the lower layers L11 and L21 and the upper layers L12 and L22 of the dams DM1 and DM2. When at least one of the dams DM1 and DM2 is formed in a single layer, the dams DM1 and DM2 may be formed of the same layer as the insulating layer 182 rather than the fifth insulating layer 360 to reduce the capacitance of the shielding layer SL and the driving circuit DC. This is because the shielding layer SL may be formed between the fourth insulating layer 182 and the fifth insulating layer 360 in the process.

Although the process steps may be large before and after the dams DM1 and DM2, since the dams DM1 and DM2 are formed of an organic insulating material having a smooth taper angle, even if the shielding layer SL is formed to cover the lower layers L11 of the dams DM1 and DM2 or the entirety of the dams DM1 and DM2, the shielding layer SL may still be formed without being disconnected. In other words, the shielding layer SL may remain intact. The shielding layer SL may include portions that are not disposed on the dams DM1 and DM2 or the fourth insulating layer 182. However, since the third insulating layer 181 is disposed between the driving circuit DC and the shielding layer SL, a short circuit between the driving circuit DC and the shielding layer SL does not occur. The shielding layer SL, which is a conductive layer, may have better adhesion with a layer formed of an inorganic insulating material than an organic insulating material. An adhesion force of the shielding layer SL may be increased by a portion in contact with the third insulating layer 181 of the inorganic insulating layer, thereby preventing the shielding layer SL from lifting.

The shielding layer SL is connected to the connection member CM, and thus may be grounded with the common voltage ELVSS. Alternatively, the shielding layer SL may be directly connected to the common voltage line VC or to the second electrode E2.

Figure 8:
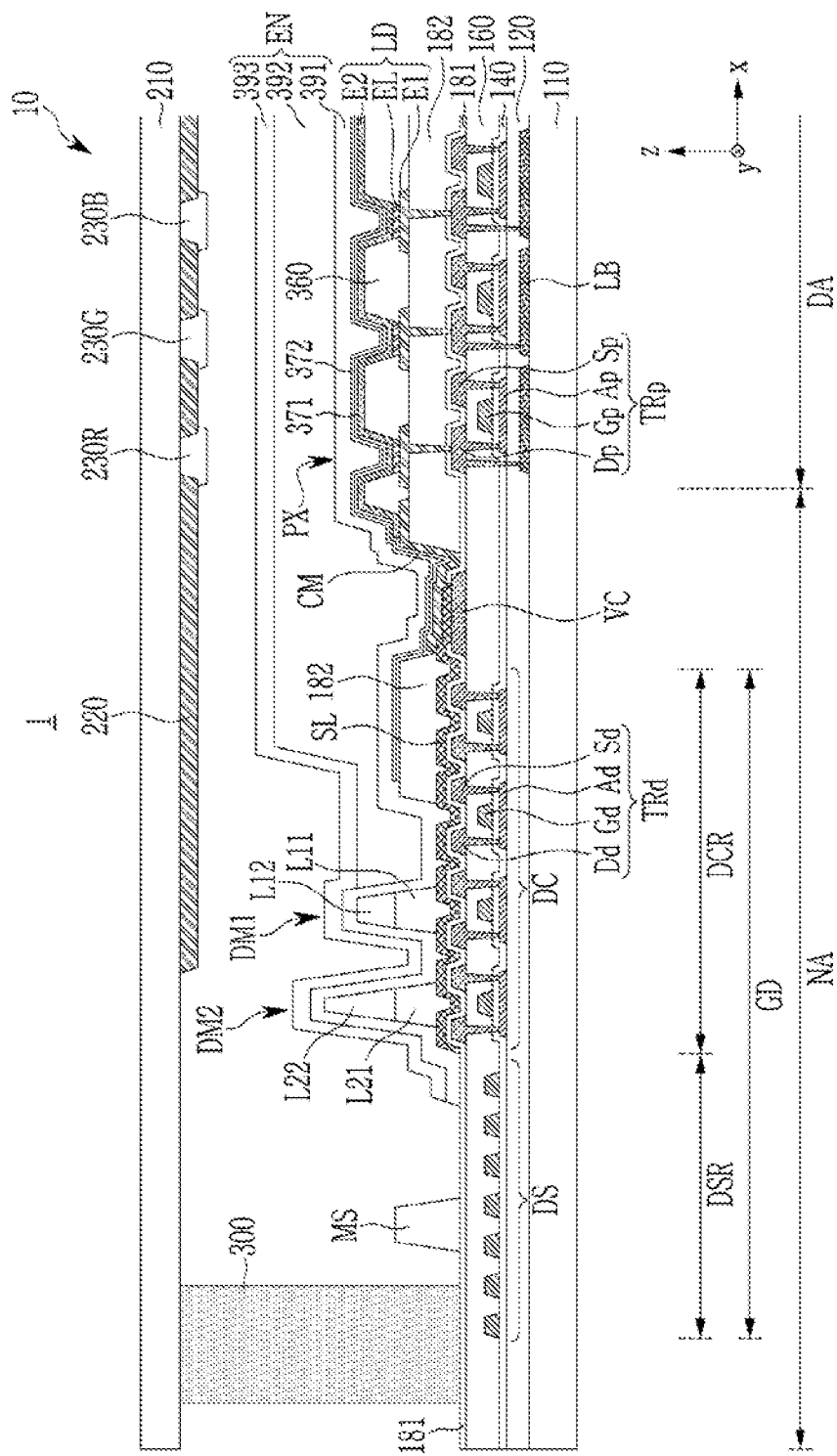

Referring to FIG. 8, there is a difference in the position of the shielding layer SL from the embodiment of FIG. 7. The shielding layer SL covers the driving circuit DC, but it is disposed below the fourth insulating layer 182, in other words, between the third insulating layer 181 and the fourth insulating layer 182. In addition, the shielding layer SL is disposed between the third insulating layer 181 and the dams DM1 and DM2. In this case, since an area in which only the third insulating layer 181 exists between the shielding layer SL and the driving circuit DC increases, the capacitive coupling with the shielding layer SL increases. However, this configuration can protect the driving circuit DC from static electricity.

The shielding layer SL may be formed of the same material in the same process as one layer of the pads of the pad part PP. For example, the shielding layer SL may be formed of a transparent conductive oxide such as ITO or IZO. The shielding layer SL may be connected to the common voltage line VC and grounded to the common voltage ELVSS. The connection member CM may be connected to the shielding layer SL while being disposed on the common voltage line VC and the shielding layer SL, or may be directly connected to the common voltage line VC.

Figure 9:
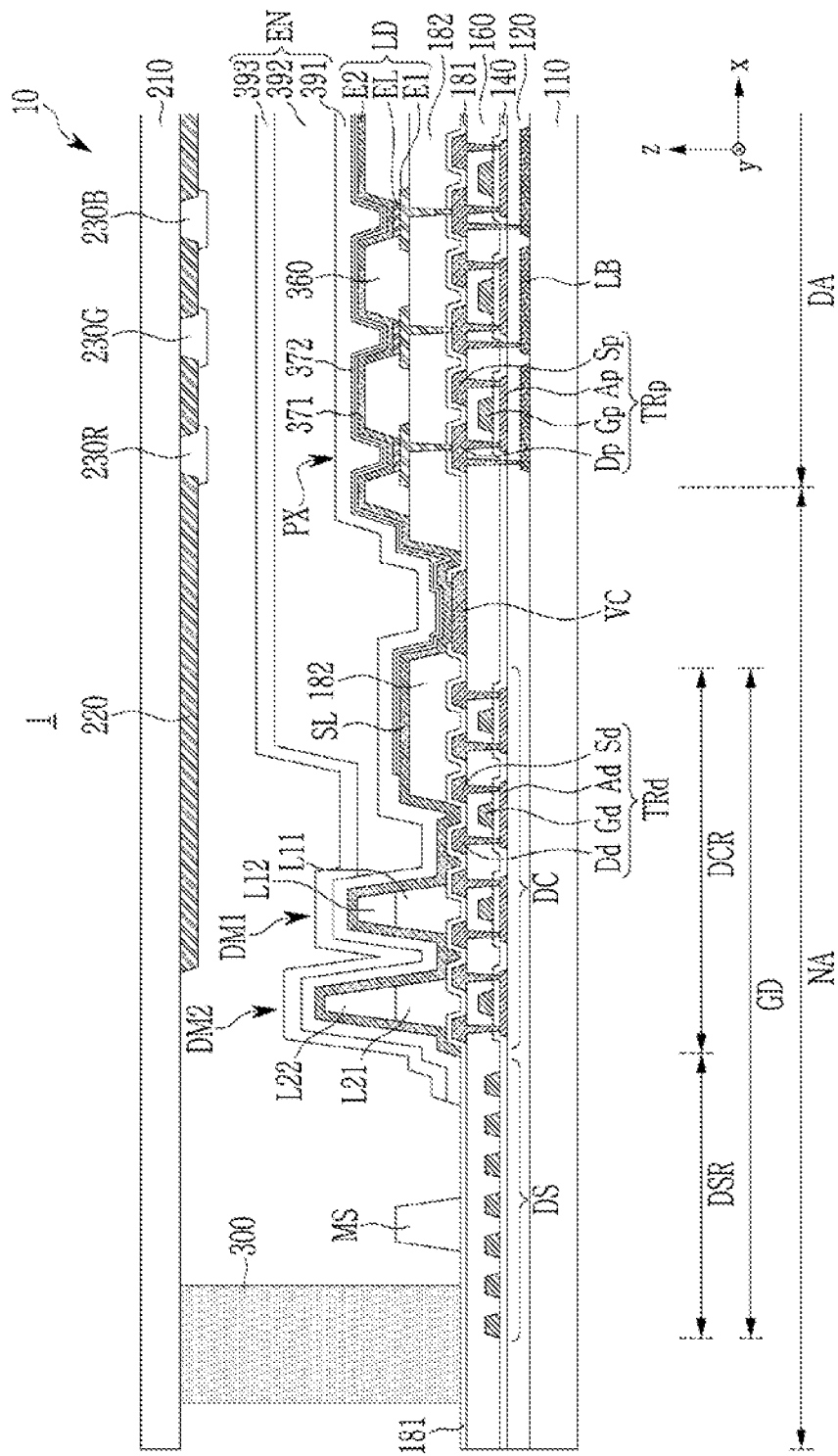

Referring to FIG. 9, unlike the embodiment of FIG. 7, the display panel 10 does not include the connecting member CM that electrically connects the second electrode E2 to the common voltage line VC. The second electrode E2 is directly connected to the common voltage line VC. The shielding layer SL may be formed by an extension of the second electrode E2. In other words, the shielding layer SL overlapping the driving circuit DC may be formed on the same layer as the second electrode E2. The second electrode E2 may be widely formed to cover the driving circuit DC so that the portion of the second electrode E2 covering the driving circuit DC may be the shielding layer SL. Since the shielding layer SL is connected to the second electrode E2 or is the part of the second electrode E2, the shielding layer SL may be grounded with the common voltage ELVSS.

In the dams DM1 and DM2, the lower layers L11 and L21 may be formed on the same layer as the fourth insulating layer 182, and the upper layers L12 and L22 may be formed on the same layer as the fifth insulating layer 360. Accordingly, the shielding layer SL may be formed to completely cover the upper layers L12 and L22 as well as the lower layers L11 and L21 of the dams DM1 and DM2. Furthermore, the shielding layer SL may cover a portion of the driving circuit DC between the dams DM1 and DM2.

Figure 10:
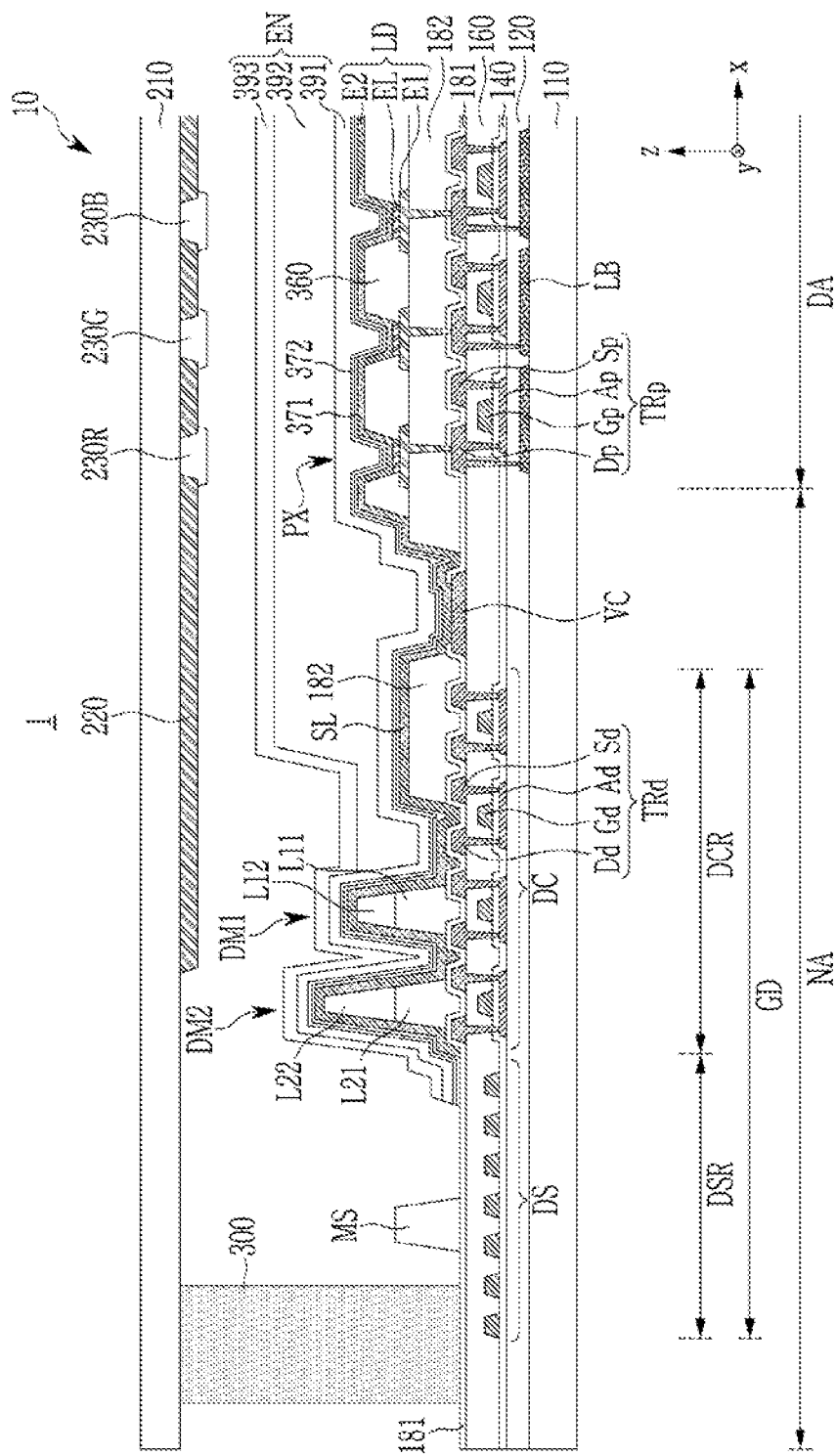

Referring to FIG. 10, the area where the capping layer 371 and the functional layer 372 are formed is different from that of the embodiment of FIG. 9. In other words, the capping layer 371 and the functional layer 372 may be formed to completely cover the shielding layer SL formed by the extension of the second electrode E2. The capping layer 371 and the functional layer 372 may be formed using the same mask: The edge of the capping layer 371 and the edge of the functional layer 372 may substantially coincide. When the shielding layer SL is formed to cover the dams DM1 and DM2, the capping layer 371 and the functional layer 372 may also be formed to cover the dams DM1 and DM2. In addition, the capping layer 371 and the functional layer 372 may cover an area beyond the dams DM1 and DM2, particularly, an area between the dam DM2 and the mask support bar MS. As such, as the capping layer 371 and the functional layer 372 are formed, the shielding layer SL may be prevented from being damaged.

Figure 11:
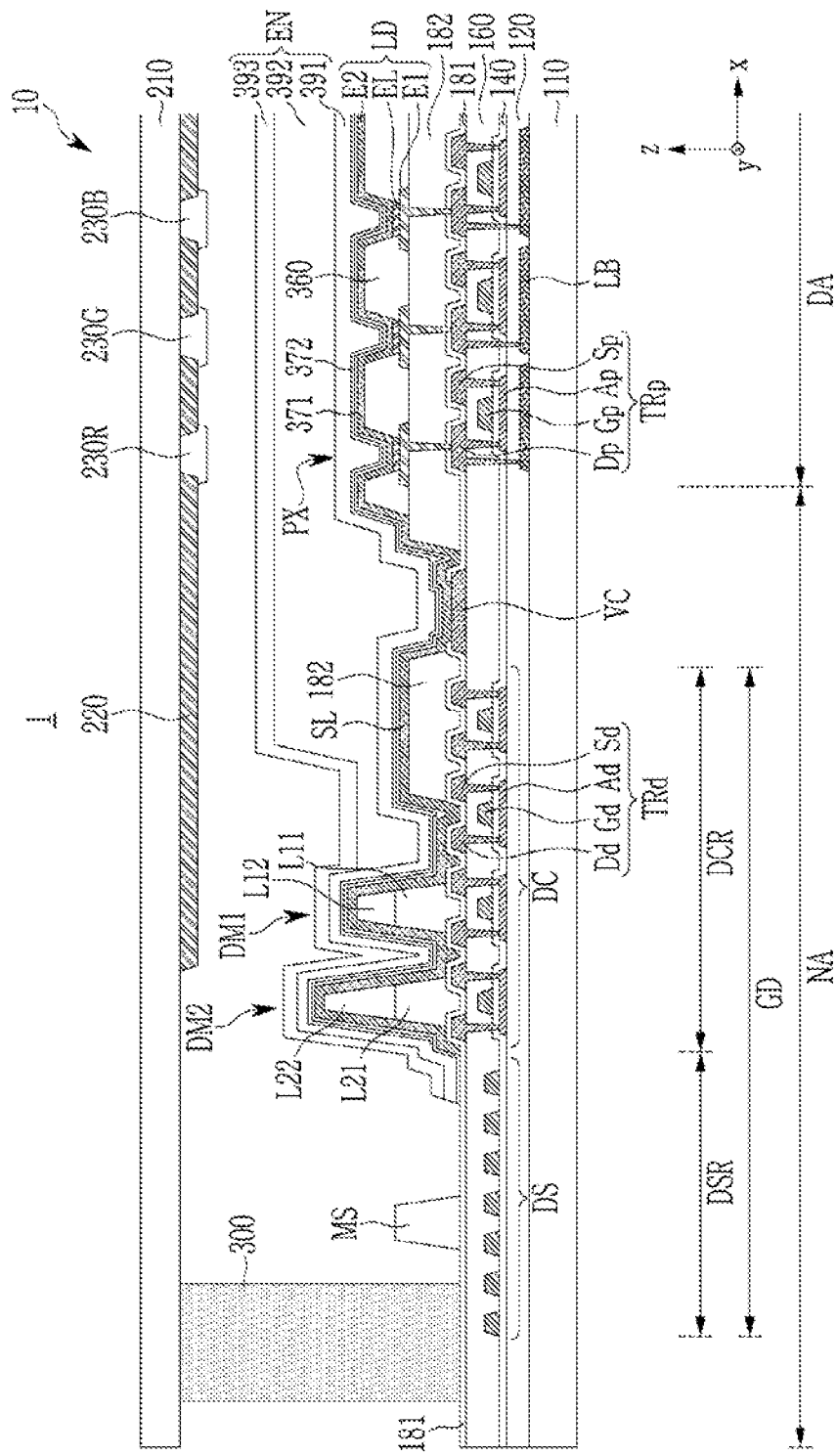

Referring to FIG. 11, there is a difference from the embodiment of FIG. 10 in the formation region of the functional layer 372. In other words, the capping layer 371 may be formed to completely cover the shielding layer SL, and the functional layer 372 may be formed to not completely cover the capping layer 371. In this case, the edge portion of the first inorganic layer 391 of the encapsulation layer EN may be in contact with the capping layer 371. For example, the edge portion of the first inorganic layer 391 may be in contact with the capping layer 371 in an area beyond the dam DM2. When the capping layer 371 is formed of an inorganic insulating material, since the edge portion of the first inorganic layer 391 of the encapsulation layer EN is in contact with the capping layer 371, which is an inorganic layer, the adhesion between the first inorganic layer 391 and the underlying layer, in other words, the capping layer 371, may be increased, thereby preventing the edge of the first inorganic layer 391 from being lifted up. The capping layer 371 and the functional layer 372 may be formed using different masks. In FIG. 10, the functional layer 372 may completely cover the shielding layer SL.

Figure 12:
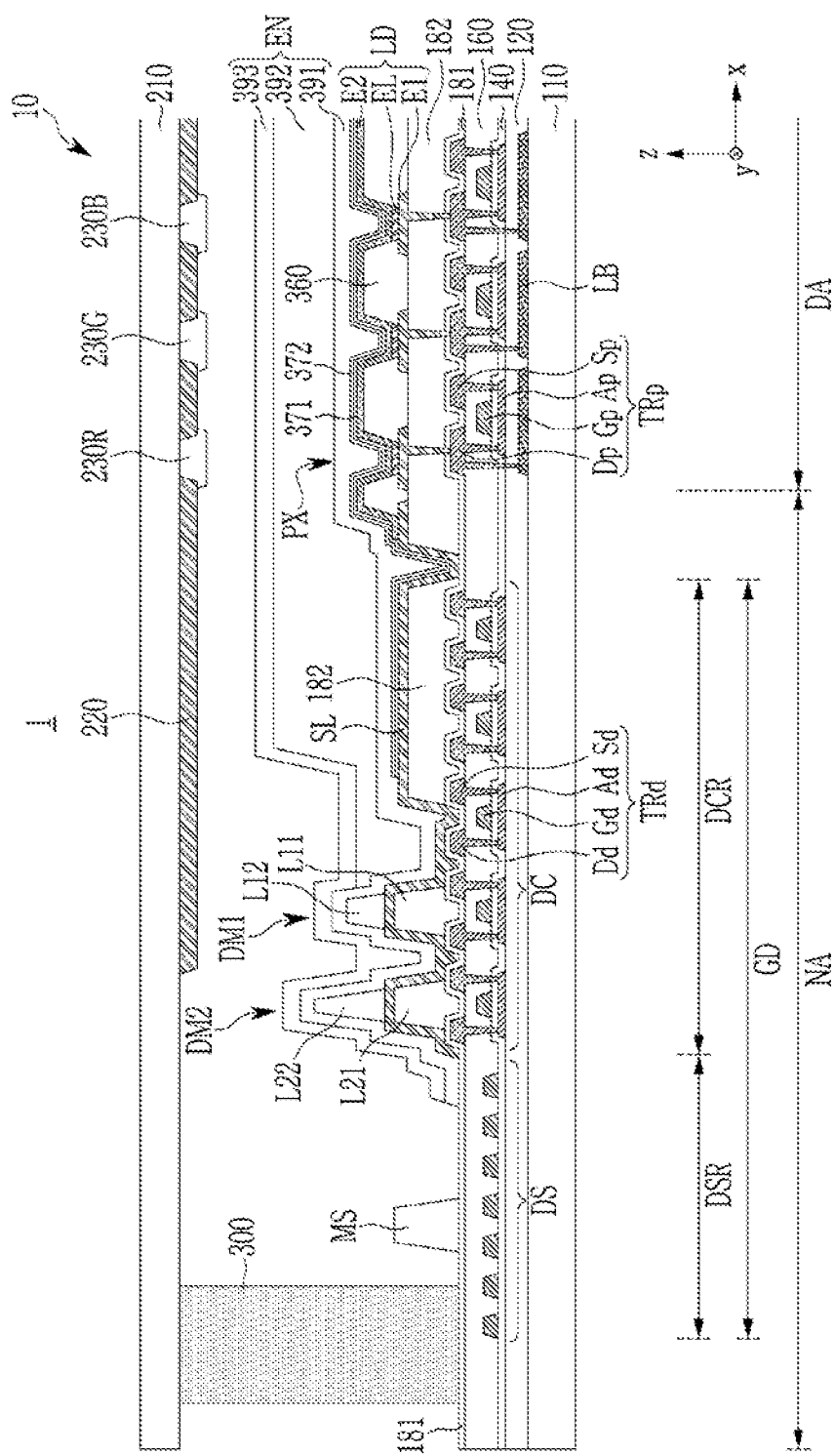

Referring to FIG. 12, the common voltage line VC is not disposed between the display area DA and the gate driver GD. In this case, the gate driver GD is arranged closer to the display area DA. As described above, with reference to the embodiment of FIG. 5, the common voltage line VC may be disposed in the upper and lower non-display areas NA of the display area DA, and the second electrode E2 may be directly connected to the common voltage line VC or through the connection member CM in the upper and lower non-display areas NA of the display area DA. The shielding layer SL may be formed of the same layer as the first electrode E1 and may be electrically connected to the second electrode E2. Therefore, the shielding layer SL may be grounded with the common voltage ELVSS.

Figure 13:
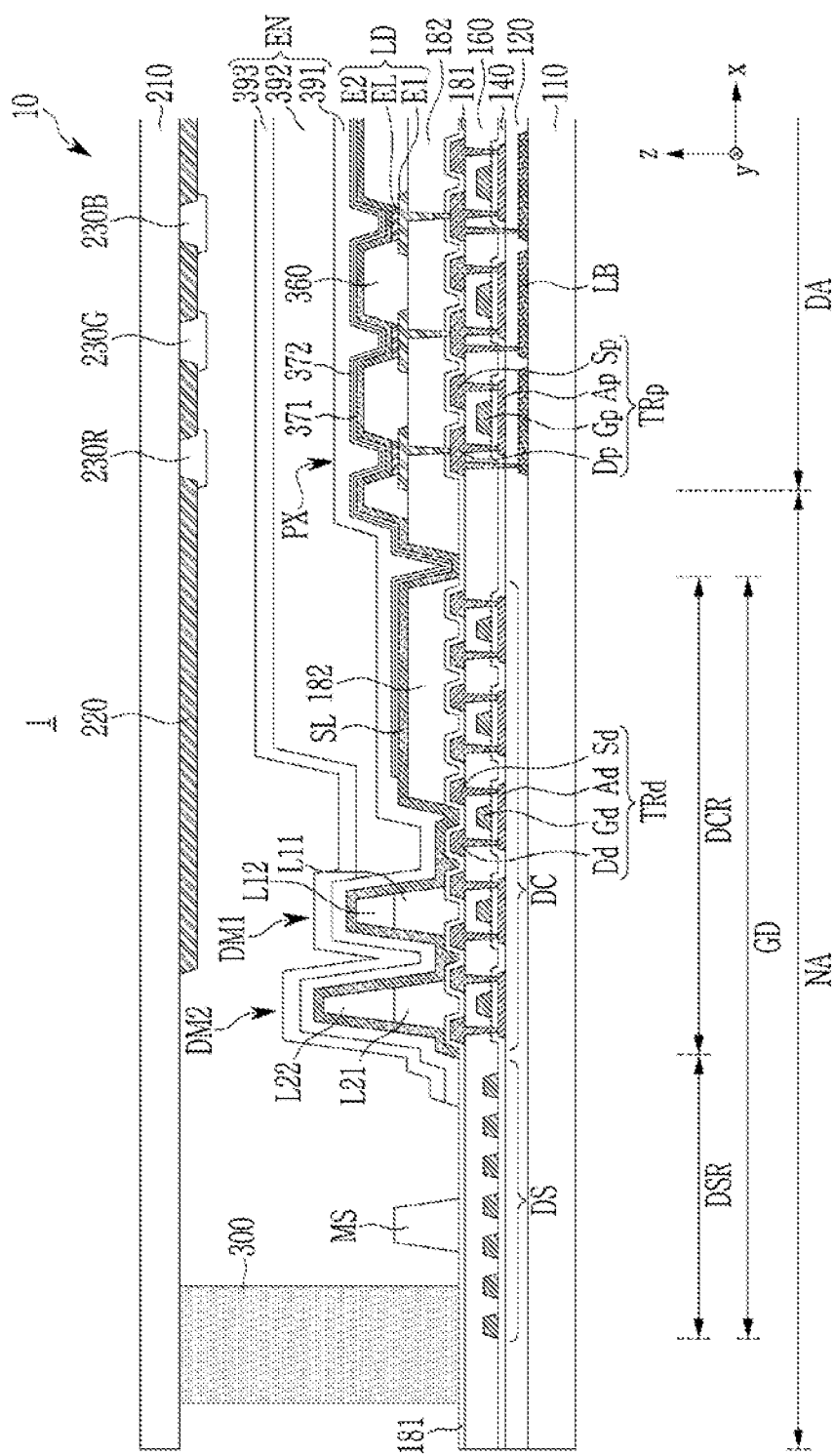

Referring to FIG. 13, like the embodiment of FIG. 12, the display panel 10 does not include the common voltage line VC between the display area DA and the gate driver GD, and the shielding layer SL is formed by the extension part of the electrode E2. Since the shielding layer SL is connected to the second electrode E2, the shielding layer SL may be grounded with the common voltage ELVSS. In the dams DM1 and DM2, the lower layers L11 and L21 may be formed on the same layer as the fourth insulating layer 182, and the upper layers L12 and L22 may be formed on the same layer as the fifth insulating layer 360. Therefore, the shielding layer SL may be formed to cover the entire dams DM1 and DM2. In FIG. 13, the capping layer 371 and the functional layer 372 may cover only a part of the shielding layer SL overlapping the driving circuit DC.

Figure 14:
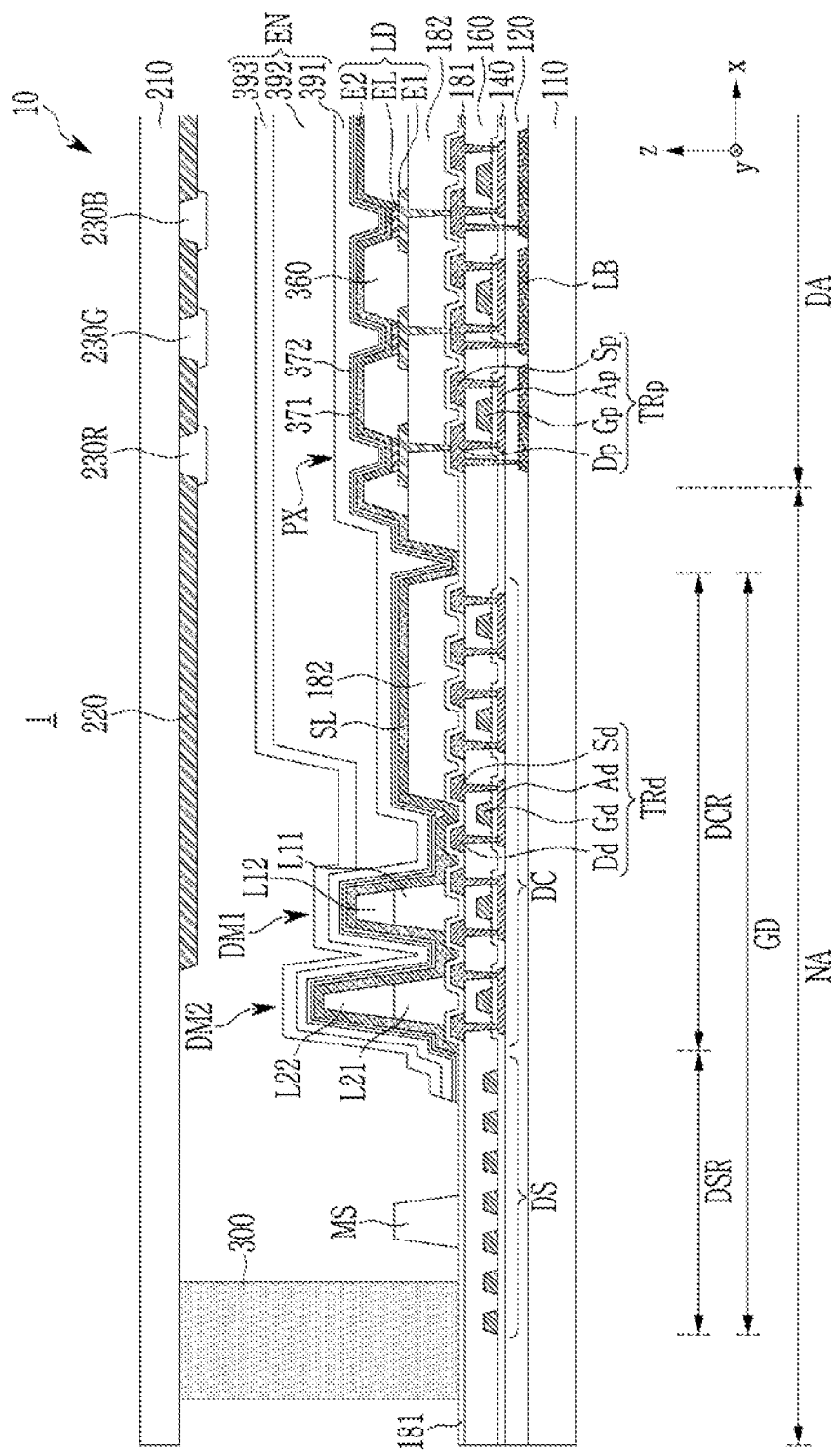

Referring to FIG. 14, the formation of the capping layer 371 and the functional layer 372 is different from that of the embodiment of FIG. 13. In other words, the capping layer 371 and the functional layer 372 may be formed to completely cover the shielding layer SL formed by the extension of the second electrode E2. The capping layer 371 and the functional layer 372 may be formed using the same mask, and the edge of the capping layer 371 and the edge of the functional layer 372 may substantially coincide. When the shielding layer SL is formed to cover the dams DM1 and DM2, the capping layer 371 and the functional layer 372 may also be formed to cover the dams DM1 and DM2. As such, the capping layer 371 and the functional layer 372 may be formed to prevent the shielding layer SL from being damaged.

Figure 15:
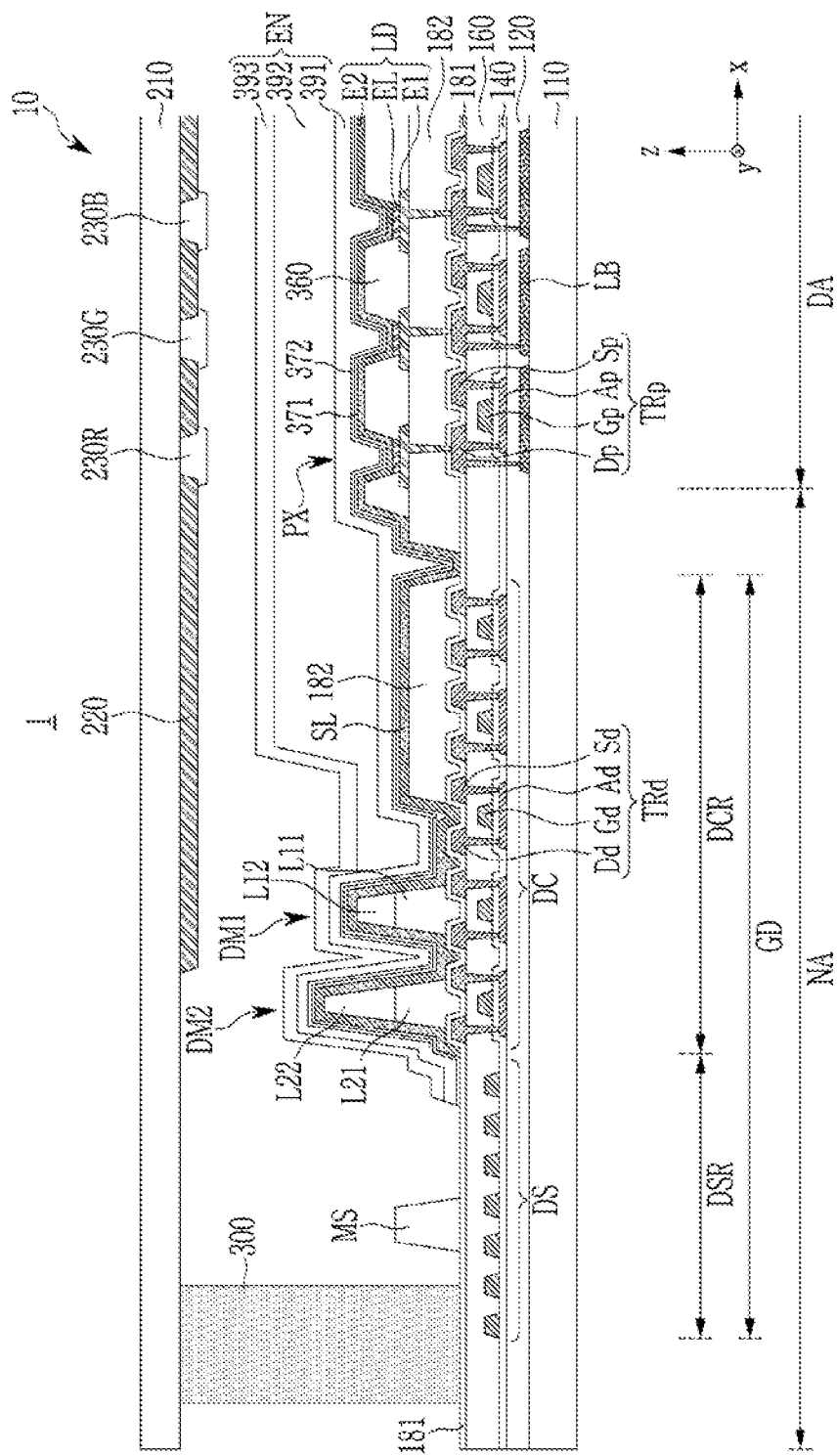

Referring to FIG. 15, there is a difference from the embodiment of FIG. 14 in the formation region of the functional layer 372. In other words, the capping layer 371 may be formed to completely cover the shielding layer SL, and the functional layer 372 may be formed so as to not completely cover the capping layer 371. In this case, an edge portion of the first inorganic layer 391 of the encapsulation layer EN may be in contact with the capping layer 371. For example, on one side of the dam DM2 the first inorganic layer 391 may be in direct contact with the capping layer 371. When the capping layer 371 is formed of an inorganic insulating material, since the edge portion of the first inorganic layer 391 of the encapsulation layer EN is in contact with the capping layer 371, which is an inorganic layer, the adhesion between the first inorganic layer 391 and the underlying layer, in other words, the capping layer 371, may be increased, thereby preventing the edge of the first inorganic layer 391 from being lifted up. The capping layer 371 and the functional layer 372 may be formed using different masks. The functional layer 372 may completely cover the shielding layer SL.

Figure 16:
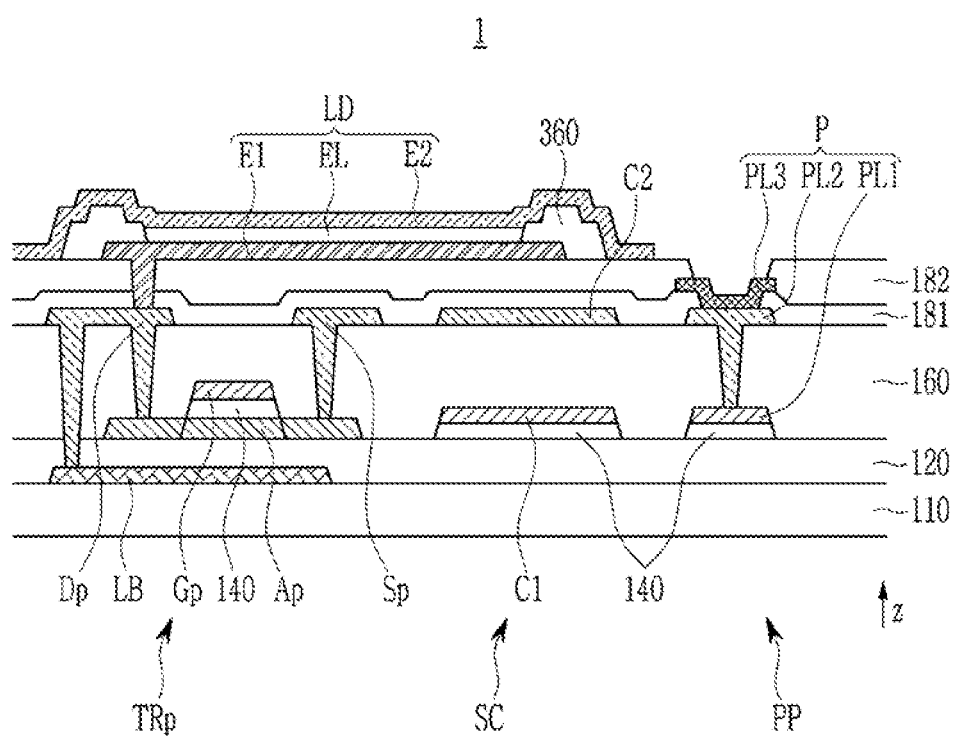
FIG. 16 is a schematic cross-sectional view of a display device according to an embodiment of the present inventive concept.

FIG. 16 is a schematic cross-sectional view of a display device according to an embodiment of the present inventive concept. In the embodiment of FIG. 8, the shielding layer SL may be formed of the same layer as one layer of the pad of the pad part PP. The structure of the pad P of the pad part PP is described based on the layer relationship with the pixel PX disposed in the display area DA with reference to FIG. 16. To avoid drawing complexity, in FIG. 16, the display area DA is shown only from the first substrate 110 to the light emitting element LD.

Referring to FIG. 16, the pad P is disposed in the pad part PP. The pad P may be formed of a plurality of layers PL1, PL2, and PL3. For example, the pad P may include a first layer PL1 that may be formed of the same material in the same process as the gate electrode Gp of the transistor TRp, a second layer PL2 that may be formed of the same material in the same process as the source electrode Sp and the drain electrode Dp of the transistor TRp, and a third layer PL3 disposed on the second layer PL2. The third layer PL3 may directly contact the second layer PL2 and the second layer PL2 may directly contact the first layer PL1. Although the three layers PL1, PL2, and PL3 are illustrated as layers constituting the pad P, the pad P may include fewer or more layers.

The first layer PL1 may be connected to wiring disposed in the non-display area NA of the display panel 10, and a portion of the wiring may form the first layer PL1.

The second layer PL2 may be connected to the first layer PL1 through the opening of the second insulating layer 160, and the third layer PL3 may be connected to the second layer PL2 through the opening of the third insulating layer 181. Therefore, the signal input to the third layer PL3 may be transferred to the wiring through the second layer PL2 and the first layer PL1.

If the second layer PL2, which is the data conductor, is formed of a single layer of copper (Cu) or an uppermost layer is formed of copper (Cu) if formed of multiple layers (for example, Ti/Cu), if the second layer PL2 is exposed to the outside, it is easy to oxidize. Therefore, to prevent oxidation of the second layer PL2, the third layer PL3 may be formed on the second layer PL2 to cover the second layer PL2 so that the second layer PL2 is not exposed. The third layer PL3 may be formed of, for example, a transparent conductive oxide such as ITO or IZO. In addition to the transparent conductive oxide, the third layer PL3 may be formed of a conductor having excellent oxidation prevention or corrosion resistance. The third layer PL3 is the uppermost layer of the pad P, is a portion that is electrically connected to a pad such as a flexible printed circuit film through an anisotropic conductive film, a solder, or the like, and may be referred to as a pad terminal. The third layer PL3 may be disposed between the third insulating layer 181 and the fourth insulating layer 182, and the fourth insulating layer 182 may cover the edge of the third layer PL3. For example, the third layer PL3 may be located in an opening of the fourth insulating layer 182. Alternatively, none of the third layer PL3 may be covered by the fourth insulating layer 182.

The shielding layer SL illustrated in FIG. 8 may be formed of the same layer as the third layer PL3 of the pad P, in other words, the same material in the same process. Accordingly, the shielding layer SL may be disposed between the third insulating layer 181 and the fourth insulating layer 182, and may be insulated from the driving circuit DC by the third insulating layer 181.

Referring still to FIG. 16, the first electrode C1 of two electrodes C1 and C2 of a storage capacitor SC included in the pixel PX may be formed of the same material as the gate electrode Gp of the transistor TRp. The second electrode C2 overlapping the first electrode C1 may be formed of the same material as the source electrode Sp and the drain electrode Dp of the transistor TRp. The first electrode C1 may be connected to the gate electrode Gp, and the second electrode C2 may be connected to the drain electrode Dp. In FIG. 16, the first insulating layer 140 is formed only in the area overlapping the gate conductor, for example. This structure may be a result of patterning the first insulating layer 140 together when patterning the gate conductor.

Figure 17:
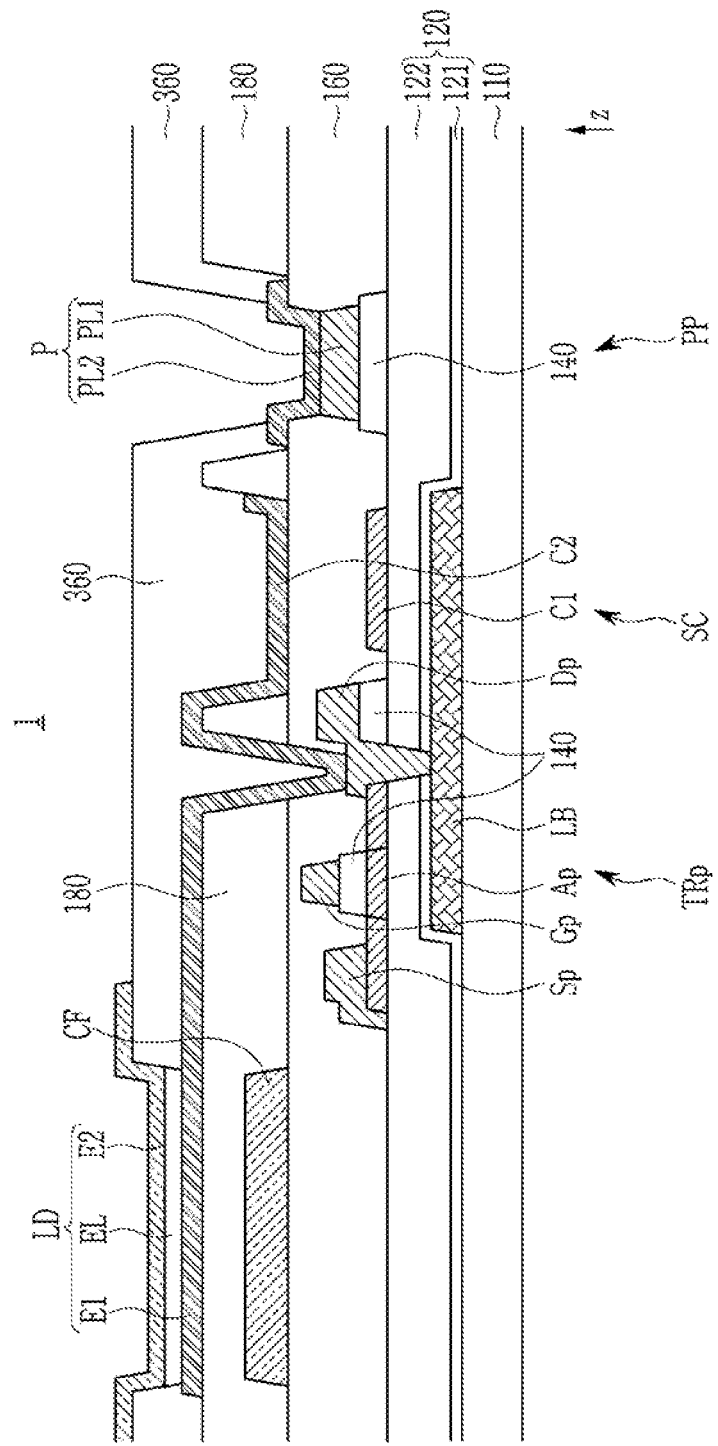
FIG. 17 is a schematic cross-sectional view of a display device according to an embodiment of the present inventive concept.

FIG. 17 is a schematic cross-sectional view of a display device according to an embodiment of the present inventive concept.

FIG. 17 shows the cross-sectional structure of the display device 1 in which the source electrode Sp, the drain electrode Dp, and the like of the transistor TRp are disposed on the same layer as the gate electrode Gp.

Referring to FIG. 17, the light blocking layer LB is disposed on the first substrate 110, and the buffer layer 120 is positioned on the light blocking layer LB. The buffer layer 120 may include a lower layer 121 and an upper layer 122.

On the buffer layer 120, the semiconductor layer Ap of the transistor TRp and the first electrode C1 of the storage capacitor SC may be disposed. For example, the semiconductor layer Ap and the first electrode C1 may contact the upper layer 122. The first electrode C1 may be the same material as the semiconductor layer Ap, and may be doped like the source region and the drain region of the semiconductor layer Ap. The first electrode C1 may be connected to the gate electrode Gp of the transistor TRp.

The first insulating layer 140 may be disposed on the buffer layer 120 and the semiconductor layer Ap. For example, the first insulating layer 140 may be provided between the gate electrode Gp and the semiconductor layer Ap. The first insulating layer 140 may also be overlapped by the drain, electrode Dp and the first layer PL1 of the pad P.

On the first insulating layer 140, the gate electrode Gp, the source electrode Sp, and the drain electrode Dp of the transistor TRp may be disposed, and the first layer PL1 of the pad P may be disposed. The gate electrode Gp, the source electrode Sp, the drain electrode Dp, and the first layer PL1 may be formed of the same material in the same process. By forming the source electrode Sp and the drain electrode Dp together with the gate electrode Gp, the number of process steps and the use of the mask for forming the source electrode Sp and the drain electrode Dp may be reduced. For example, in the embodiment of FIG. 16, the source electrode Sp and the drain electrode Dp may be formed using a separate process and a mask after forming the gate electrode Op, but in the embodiment of FIG. 17, the source electrode Sp and the drain electrode Dp may be formed using the same mask in the same process as that for forming the gate electrode Gp. The data line, the driving voltage line, and/or the common voltage line described above may also be formed of the same material in the same process as that for forming the gate electrode Gp.

The first insulating layer 140 may be removed between the source electrode Sp and the source region of the semiconductor layer Ap, and the source electrode Sp may directly contact the source region of the semiconductor layer Ap. Similarly, the first insulating layer 140 may be removed between the drain electrode Dp and the drain region of the semiconductor layer Ap, and the drain electrode Dp may directly contact the drain region of the semiconductor layer Ap. The drain electrode Dp may be connected to the light blocking layer LB through a contact hole formed in the buffer layer 120.

The second insulating layer 160 may be disposed on the gate electrode Gp, the source electrode Sp, the drain electrode Dp, and the first layer PL1.

A color filter CF may be disposed on the second insulating layer 160. The color filter CF may represent one of three primary colors, for example, red, green, and blue. In the illustrated structure, light emitted from the light emitting element LD may pass through the color filter CF and may be emitted to the rear surface of the display device 1 through the first substrate 110. Since three primary colors may be displayed by the color filter CF, the light-emitting element LD may emit white light and/or blue light.

The third insulating layer 180 may be disposed on the second insulating layer 160 and the color filter CF. The third insulating layer 180 may be referred to as a planarization layer or an overcoat layer.

On the third insulating layer 180, the first electrode E1 of the light-emitting element LD, the second electrode C2 of the storage capacitor SC, and the second layer PL2 of the pad P may be disposed. The first electrode E1, the second electrode C2 and the second layer PL2 may be formed of the same material in the same process.

The first electrode E1 may be connected to the drain electrode Dp through the contact hole formed in the third insulating layer 180 and the second insulating layer 160. The second electrode C2 may also be connected to the drain electrode Dp through the contact hole formed in the third insulating layer 180 and the second insulating layer 160. The second electrode C2 may form the storage capacitor SC along with the overlapped first electrode C1.

The second layer PL2 may be connected to the first layer PL1 through the opening of the third insulating layer 180 and the second insulating layer 160. The second layer PL2 may be the pad terminal, and a signal input to the second layer PL2 may be transmitted to the wiring through the first layer PL1. For example, since the first layer PL1 is connected to the wiring, signals input to the pad terminal may be provided thereto.

The fifth insulating layer 360 may be disposed on the first electrode B1, the second electrode C2, and the second layer PL2. The fifth insulating layer 360 may have the opening overlapping the first electrode E1 and the opening overlapping the second layer PL2. In other words, the first electrode E1 may be provided in a first opening of the fifth insulating layer 360 and the second layer PL2 may be provided in a second opening of the fifth insulating layer 360.

The emission layer EL may be disposed on the first electrode E1, and the second electrode E2 may be disposed on the emission layer EL. The first electrode E1, the emission layer EL, and the second electrode E2 may form the light-emitting element LD.

Figure 18:
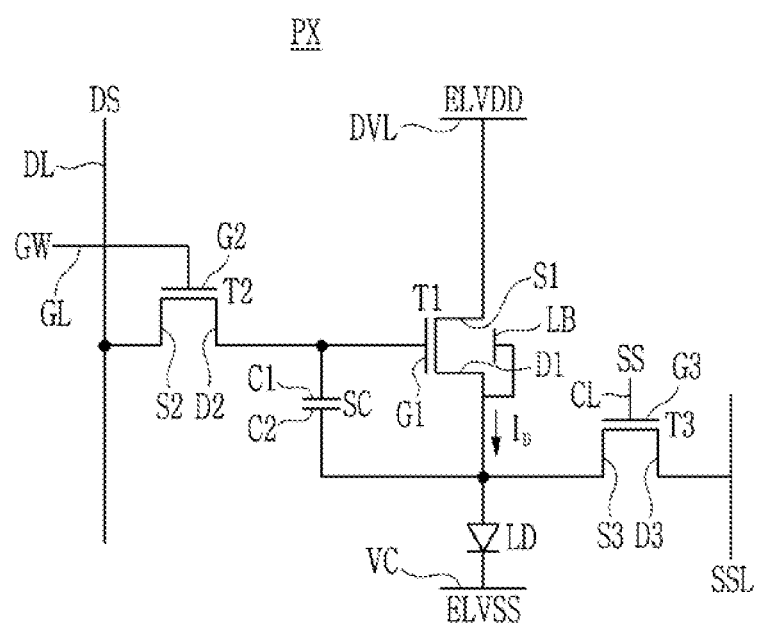
FIG. 18 is an equivalent circuit diagram of a pixel in a display device according to an embodiment of the present inventive concept.

FIG. 18 is an equivalent circuit diagram of a pixel in a display device according to an embodiment of the present inventive concept. Referring to FIG. 18, the pixel PX includes the plurality of transistors T1, T2, and T3, the storage capacitor SC, and the light-emitting element LD. A plurality of signal lines DL, GL, CL, SSL, DVL, and VC are connected to the pixel PX. Although the structure in which the pixel PX consists of three transistors and one capacitor is shown, the number of transistors and capacitors may vary. For example, more than three transistors and more than two capacitors may be included in the pixel PX. Although the structure in which six signal lines are connected to the pixel PX is shown, the kind and the number of signal lines may vary.

The signal lines DL, GL, CL, SSL, DVL, and VC may include a data line DL, a gate line GL, a sensing control line CL, a sensing line SSL, a driving voltage line DVL, and a common voltage line VC. The gate line GL may transfer the gate signal GW to the second transistor T2. For example, the gate signal GW may be provided to a gate electrode of the second transistor T2. The data line DL may transfer the data signal DS, the driving voltage line DVL may transfer the driving voltage ELVDD, and the common voltage line VC may transfer the common voltage ELVSS. The sensing control line CL may transmit the sensing signal SS, and the sensing line SSL may be connected to a sensing unit.

The transistors T1, T2, and T3 include a first transistor T1 as a driving transistor, a second transistor T2 as a switching transistor, and a third transistor T3 as a sensing transistor. Each transistor T1, T2, and T3 is a three-terminal element including a gate electrode G1, 02, and G3, a source electrode S1, S2, and S3 and a drain electrode D1, D2, and D3, respectively. The source electrode and the drain electrode are not fixed, and one of the two terminals except the gate electrode in the three terminals of the transistor may be referred to as the source electrode and the other may be referred to as the drain electrode.

The gate electrode G1 of the first transistor T1 is connected to the first electrode C1 of the storage capacitor SC and the drain electrode D2 of the second transistor T2, the source electrode S1 of the first transistor T1 is connected to the driving voltage line DVL, and the drain electrode D1 of the first transistor T1 is connected to the anode of the light-emitting element LD. The first transistor T1 may supply the driving current $I_D$, which changes depend on the magnitude of the data signal DS transmitted through the second transistor T2, and the light-emitting element LD may emit light with luminance that varies according to the magnitude of the current $I_D$. Therefore, the pixel PX may display gray scales by adjusting the amount of the current flowing through the first transistor T1 according to the magnitude of the data signal DS. The driving current $I_D$ may be associated with a gate-source voltage $V_{GS}$ which is a voltage between the gate electrode G1 and the source electrode S1 of the first transistor T1. In other words, as the voltage $V_{GS}$ of the first transistor T1 is larger, the driving current $I_D$ may be greater. Since the light blocking layer LB that may overlap the semiconductor layer of the first transistor T1 is connected to the drain electrode D1 of the first transistor T1, the characteristics of the first transistor T1 such as an output saturation characteristic may be improved.

The gate electrode G2 of the second transistor T2 is connected to the gate line GL, the source electrode S2 of the second transistor T2 is connected to the data line DL, and the drain electrode D2 of the second transistor T2 is connected to the gate electrode G1 of the first transistor T1 and the first electrode C1 of the storage capacitor SC. The second transistor T2 is turned on according to the gate signal GW received through the gate line GL such that a switching operation in which the data signal DS transmitted through the data line DL is transmitted to the gate electrode G1 of the first transistor T1 and the first electrode C1 of the storage capacitor SC may be performed.

The gate electrode 03 of the third transistor T3 is connected to the sensing control line CL, the source electrode S3 of the third transistor T3 is connected to the drain electrode D1 of the first transistor T1 and the anode of the light-emitting element LD, and the drain electrode D3 of the third transistor T3 is connected to the sensing line SSL. The drain electrode D3 of the third transistor T3 is also connected to the second electrode C2 of the storage capacitor SC. The third transistor T3 is a transistor for sensing a characteristic such as a threshold voltage of the first transistor T1 that causes deterioration of image quality. The third transistor T3 is turned on depending on the sensing signal SS transmitted through the sensing control line CL such that the first transistor T1 and the sensing line SSL may be electrically connected and the sensing unit connected to the sensing line SSL may sense the characteristic information of the first transistor T1 during a sensing period. By generating the compensated data signal by reflecting the characteristic information sensed by the third transistor T3 during the sensing period, it is possible to externally compensate the characteristic variation of the first transistor T1 that may be different for each pixel PX.

The first electrode C1 of the storage capacitor SC is connected to the gate electrode G1 of the first transistor T1 and the drain electrode D2 of the second transistor T2, and the second electrode C2 of the storage capacitor SC is connected to the drain electrode D1 of the first transistor T1 and the anode of the light-emitting element LD.

The storage capacitor SC may continuously apply the charged data signal DS to the first transistor T1 to continuously emit light of the light emitting element LD during a light emission period. The cathode of the light-emitting element LD may be connected to the common voltage line VC transmitting the common voltage ELVSS.

According to an embodiment of the present inventive concept, the display device 1 may include: the substrate 110 including the display area DA and the non-display area NA; the light-emitting element LD disposed in the display area DA; the driving circuit DC disposed in the non-display area NA; driving lines DS connected to the driving circuit DC, the driving lines DS disposed in the non-display area NA; the dam DM1/DM2 disposed in the non-display area NA and overlapping the driving lines DS; and the shielding layer SL overlapping the driving circuit DC.

According to the embodiments of the present inventive concept described above, a circuit such as a driving circuit disposed in the non-display area may be protected from static electricity while reducing the non-display area of the display panel.

While the present inventive concept has been particularly shown and described with reference to embodiments thereof, it is to be understood by those skilled in the art that various modifications can be made thereto without departing from the spirit and scope of the inventive concept as set forth in the appended claims.

What is claimed is:

1. A display device, comprising:
a substrate including a display area and a non-display area;
a light-emitting element disposed in the display area;
an encapsulation layer covering the light-emitting element;
a driving unit disposed in the non-display area and including a driving circuit and driver control lines, wherein the driver control lines are electrically connected to the driving circuit and transmit a vertical start signal or a clock signal to the driving circuit;
a dam surrounding the display area and overlapping the driver control lines;
a shielding layer overlapping the driving unit; and
a common voltage line disposed between the driving unit and the display area,
wherein the dam is spaced apart from the driving circuit and the shielding layer in a plan view,
wherein the shielding layer is a conductive layer and does not overlap the dam, and
wherein the shielding layer, a distinct and separate conductive laver, overlaps the common voltage line in the plan view and is directly connected to the common voltage line.

2. The display device of claim 1, wherein
the shielding layer covers at least a portion of the driving circuit.

3. The display device of claim 2, further comprising:
an inorganic insulating layer disposed on the transistor; and
an organic insulating layer disposed on the inorganic insulating layer, and
the shielding layer is in contact with the organic insulating layer where the shielding layer overlaps the driving circuit and is not in contact with the inorganic insulating layer where the shielding layer overlaps the driving circuit.

4. The display device of claim 1, wherein
the shielding layer completely covers the driving circuit.

5. The display device of claim 4, wherein
an inorganic insulating layer is disposed on the transistor,
an organic insulating layer is disposed on the inorganic insulating layer, and
the shielding layer contacts the organic insulating layer and the inorganic insulating layer in an area where the shielding layer overlaps the driving circuit.

6. The display device of claim 5, wherein
a lower surface of the shielding layer is in contact with the inorganic insulating layer and a first portion of an upper surface of the shielding layer is in contact with the organic insulating layer.

7. The display device of claim 1, wherein
the light-emitting element includes a first electrode, an emission layer disposed on the first electrode, and a second electrode disposed on the emission layer, and
the shielding layer includes a same material as the first electrode or the second electrode.

8. The display device of claim 1, further comprising:
a pad disposed in the non-display area, and
the shielding layer includes a same material as an uppermost layer of the pad.

9. The display device of claim 1, further comprising:
a capping layer disposed between the light-emitting element and the encapsulation layer, and
the shielding layer contacts the capping layer.

10. The display device of claim 1, wherein
the driving unit is integrated in the non-display area.

11. A display device, comprising:
a first substrate including a display area and a non-display area;
a light-emitting element disposed in the display area;
an encapsulation layer covering the light-emitting element and the display area and including at least one inorganic layer and at least one organic layer;
a driving unit disposed in the non-display area and including a driving circuit and driver control lines, wherein the driver control lines are electrically connected to the driving circuit and transmit a vertical start signal or a clock signal to the driving circuit;
a dam overlapping the driver control lines;
a shielding layer overlapping the driving unit;
a common voltage line disposed between the driving unit and the display area;
a second substrate disposed on the encapsulation layer; and
a sealing member bonding the first substrate and the second substrate,
wherein the dam is spaced apart from the driving circuit and the shielding layer in a plan view,
wherein the shielding layer is a conductive layer and does not overlap the dam, and
wherein the shielding layer, a distinct and separate conductive layer, overlaps the common voltage line in the plan view and is directly connected to the common voltage line.

12. The display device of claim 11, wherein
the shielding layer covers at least a portion of the driving circuit.

13. The display device of claim 12, wherein
an inorganic insulating layer is disposed on the transistor,
an organic insulating layer is disposed on the inorganic insulating layer, and
the shielding layer is in contact with the organic insulating layer where the shielding layer overlaps the driving circuit and is not in contact with the inorganic insulating layer where the shielding layer overlaps the driving circuit.

14. The display device of claim 12, further comprising:
an inorganic insulating layer disposed on the transistor; and
an organic insulating layer disposed on the inorganic insulating layer, and
the shielding layer contacts the organic insulating layer and the inorganic insulating layer in an area where the shielding layer overlaps the driving circuit.

15. The display device of claim 11, further comprising:
a capping layer disposed between the light-emitting element and the encapsulation layer, and
the shielding layer contacts the capping layer.

16. The display device of claim 11, wherein
a color filter is disposed on the second substrate and includes at least one of a quantum dot and a phosphor.

17. The display device of claim 11, wherein
a capping layer is disposed between the light-emitting element and the encapsulation layer,
a functional layer is disposed on the capping layer between the light-emitting element and the encapsulation layer, and at least one of the capping layer and the functional layer completely covers the shielding layer.

18. A display device, comprising:
a substrate including a display area and a non-display area;
a light-emitting element disposed in the display area;
a driving circuit disposed in the non-display area and including transistors;
driving lines electrically connected to the driving circuit, the driving lines disposed in the non-display area;
a dam disposed in the non-display area and overlapping the driving lines, wherein the driving lines transmit a vertical start signal or a clock signal to the driving circuit; and
a shielding layer overlapping the driving circuit,
wherein the dam is spaced apart from the driving circuit and the shielding layer in a plan view,
wherein the shielding layer is a conductive layer and does not overlap the dam, and
wherein the shielding layer, a distinct and separate conductive layer, overlaps a common voltage line in the plan view and is directly connected to the common voltage line.

19. The display device of claim 18, wherein the dam surrounds the display area.

20. The display device of claim 18, further comprising an encapsulating layer covering the light-emitting element and extending to the non-display area, wherein the encapsulating layer is disposed between the dam and the driving circuit.

21. The display device of claim 18, wherein the shielding layer is an extended portion of the light-emitting element.

22. The display device of claim 18, wherein the shielding layer is disposed between the dam and the driving circuit.

* * * * *